US010337891B2

(12) United States Patent
Yokotani et al.

(10) Patent No.: US 10,337,891 B2
(45) Date of Patent: Jul. 2, 2019

(54) MAGNETIC DETECTION APPARATUS WITH A TUNNEL MAGNETORESISTIVE ELEMENT

(71) Applicant: Mitsubishi Electric Corporation, Tokyo (JP)

(72) Inventors: Masahiro Yokotani, Tokyo (JP); Hideki Shimauchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 50 days.

(21) Appl. No.: 14/917,423

(22) PCT Filed: Oct. 18, 2013

(86) PCT No.: PCT/JP2013/078332
§ 371 (c)(1),
(2) Date: Mar. 8, 2016

(87) PCT Pub. No.: WO2015/056346
PCT Pub. Date: Apr. 23, 2015

(65) Prior Publication Data
US 2016/0223360 A1 Aug. 4, 2016

(51) Int. Cl.
G01R 33/06 (2006.01)
G01D 5/244 (2006.01)
G01R 33/09 (2006.01)

(52) U.S. Cl.
CPC ............ G01D 5/2448 (2013.01); G01D 5/244 (2013.01); G01R 33/098 (2013.01)

(58) Field of Classification Search
CPC ... G11C 11/161; G11C 11/1673; G11C 11/16; G11C 11/5607; G11C 5/025;
(Continued)

(56) References Cited

U.S. PATENT DOCUMENTS 6,870,365 B1* 3/2005 Yokotani ............... G01D 5/145
324/207.19
6,977,497 B1 12/2005 Yokotani et al.
(Continued)

FOREIGN PATENT DOCUMENTS

JP 2001-217478 A 8/2001
JP 2003-215145 A 7/2003
(Continued)

OTHER PUBLICATIONS

Communication dated Sep. 20, 2017 from the Korean Intellectual Property Office in counterpart Application No. 10-2016-7009910.
(Continued)

Primary Examiner — Vinh P Nguyen
(74) Attorney, Agent, or Firm — Sughrue Mion, PLLC; Richard C. Turner

(57) ABSTRACT

Included are an element having a magnetic tunnel junction structure configured such that an insulating layer is sandwiched between a pinned layer having a fixed magnetization direction and a free layer having a magnetization direction that varies freely, a magnet, and a rotating magnetic moving body having an irregular shape that induces change in the magnetic field. When, using the element as a reference, the magnetization direction of the pinned layer is set as an X axis direction, a direction perpendicular to the X axis direction and perpendicular to a plane of the pinned layer is set as a Z axis direction, and a direction perpendicular to an XZ plane constituted by the X axis direction and the Z axis direction is set as a Y axis direction, the magnetic moving body is disposed opposite the element in the Y axis direction via a gap relative to the element.

18 Claims, 43 Drawing Sheets

(58) Field of Classification Search
CPC ..... G11C 13/04; G11C 19/0808; G11C 11/02;
G11C 13/06; G01R 33/098; G01R
33/093; G01R 33/09; G01R 33/1284;
G01R 33/0052; G01R 33/091; G01R
17/00; G01R 33/0011; G01R 33/0082;
G01R 33/0206; G01R 33/022; G01R
33/028; G01R 33/096; G01R 2005/3996;
G11B 2005/3996; G11B 5/3932; G11B
5/3903; G11B 5/3163; G11B 5/39; G11B
2005/0016; G11B 5/012; G11B 7/30;
G06F 13/4068; G01D 5/142; G01D
5/145; G01D 5/16; G01D 5/244; G01D
5/2448; G01P 13/045; G01P 3/488; G01P
3/54

See application file for complete search history.

(56) References Cited

U.S. PATENT DOCUMENTS

| | | | | |
|---|---|---|---|---|
| 7,982,456 B2 * | 7/2011 | Kawano | ............... | G01D 11/245 324/207.25 |
| 8,686,520 B2 * | 4/2014 | Worledge | ............... | H01L 43/08 257/421 |
| 10,008,248 B2 * | 6/2018 | Buhrman | ............... | H01L 43/08 |
| 2006/0012922 A1 | 1/2006 | Shoji | | |
| 2009/0140725 A1 | 6/2009 | Ausserlechner | | |
| 2009/0256552 A1 | 10/2009 | Guo et al. | | |
| 2011/0051503 A1 * | 3/2011 | Hu | ............... | G11C 11/161 365/158 |
| 2012/0126797 A1 | 5/2012 | Kawano et al. | | |
| 2012/0280677 A1 | 11/2012 | Furukawa et al. | | |

FOREIGN PATENT DOCUMENTS

| | | |
|---|---|---|
| JP | 2006-29900 A | 2/2006 |
| JP | 4132835 B2 | 8/2008 |
| JP | 2009-250984 A | 10/2009 |
| JP | 2012-112703 A | 6/2012 |
| KR | 10-2006-0005970 A | 1/2006 |
| WO | 2011/102050 A1 | 8/2011 |

OTHER PUBLICATIONS

International Search Report for PCT/JP2013/078332 dated Dec. 10, 2013.

* cited by examiner

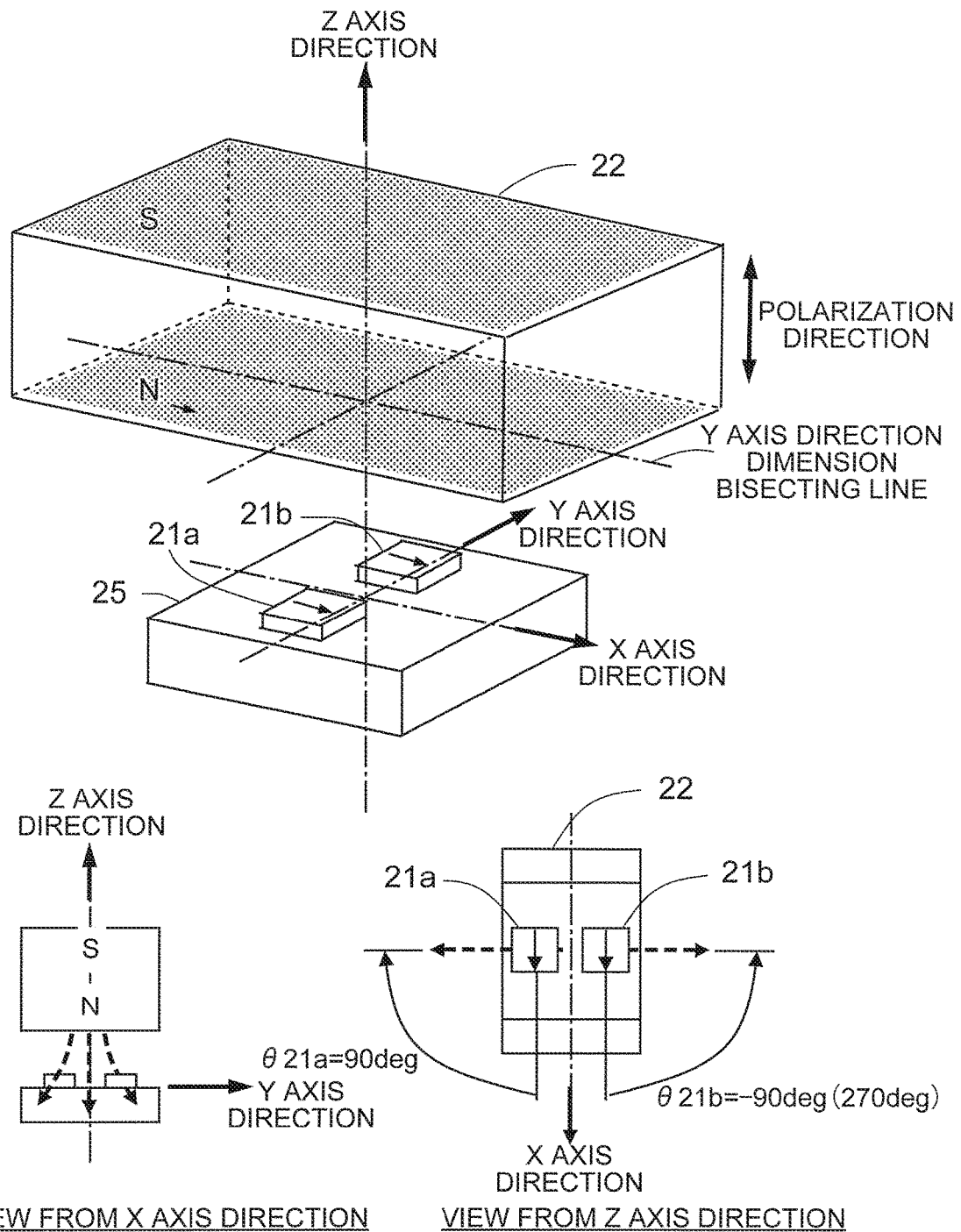

FIG. 20
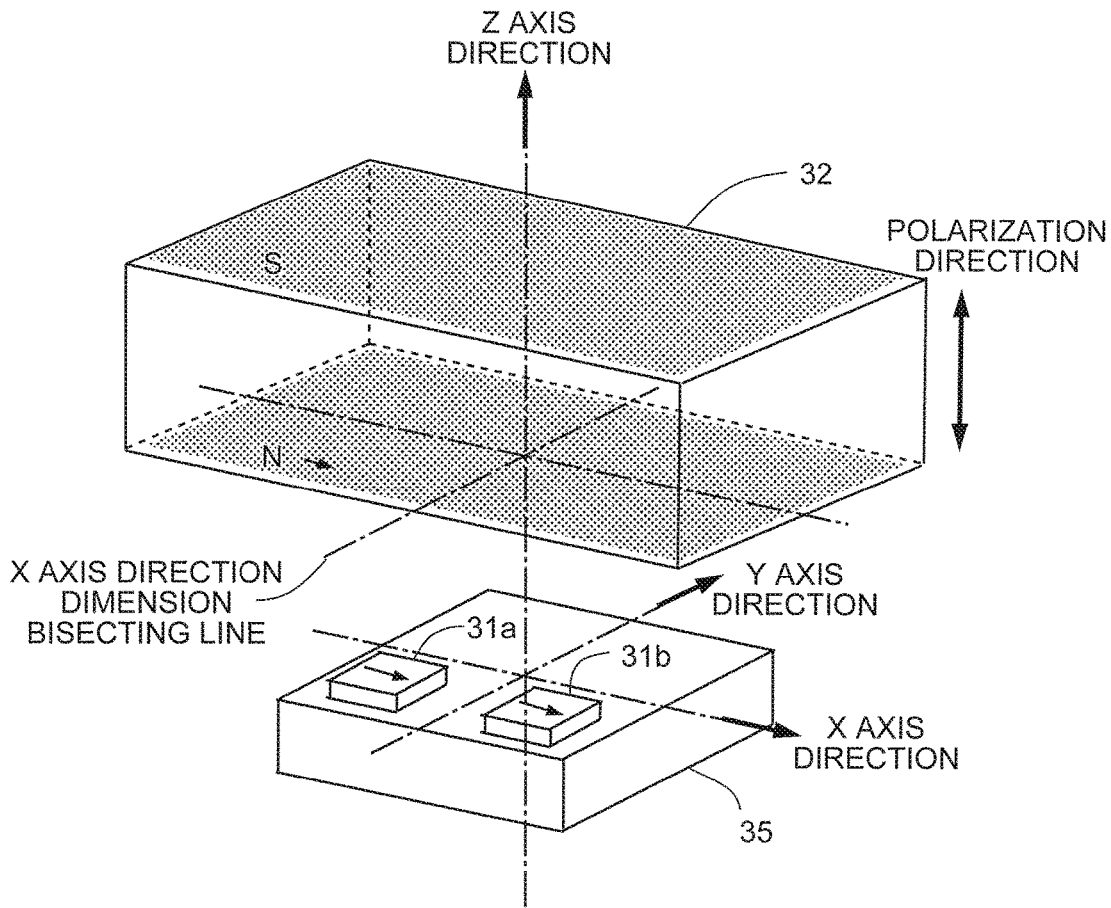
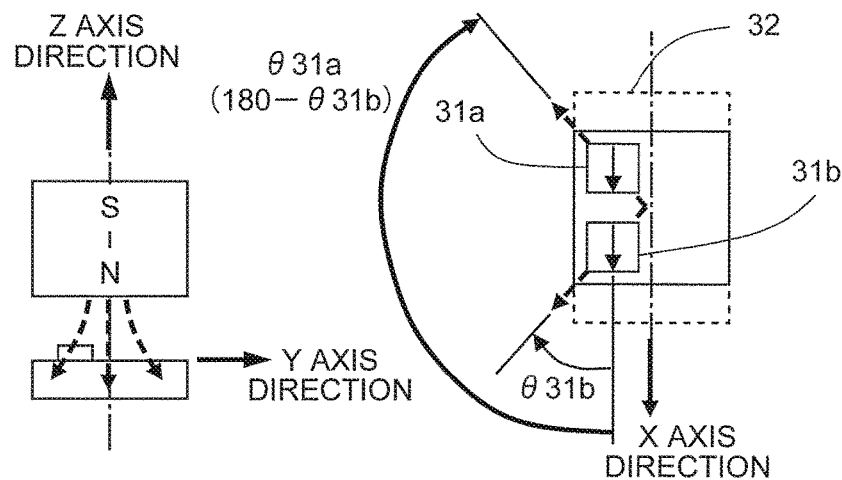
VIEW FROM X AXIS DIRECTION    VIEW FROM Z AXIS DIRECTION VARIATION IN ANGLE OF MAGNETIC FIELD APPLIED TO TMR31a VARIATION IN ANGLE OF MAGNETIC FIELD APPLIED TO TMR31b FIG. 28
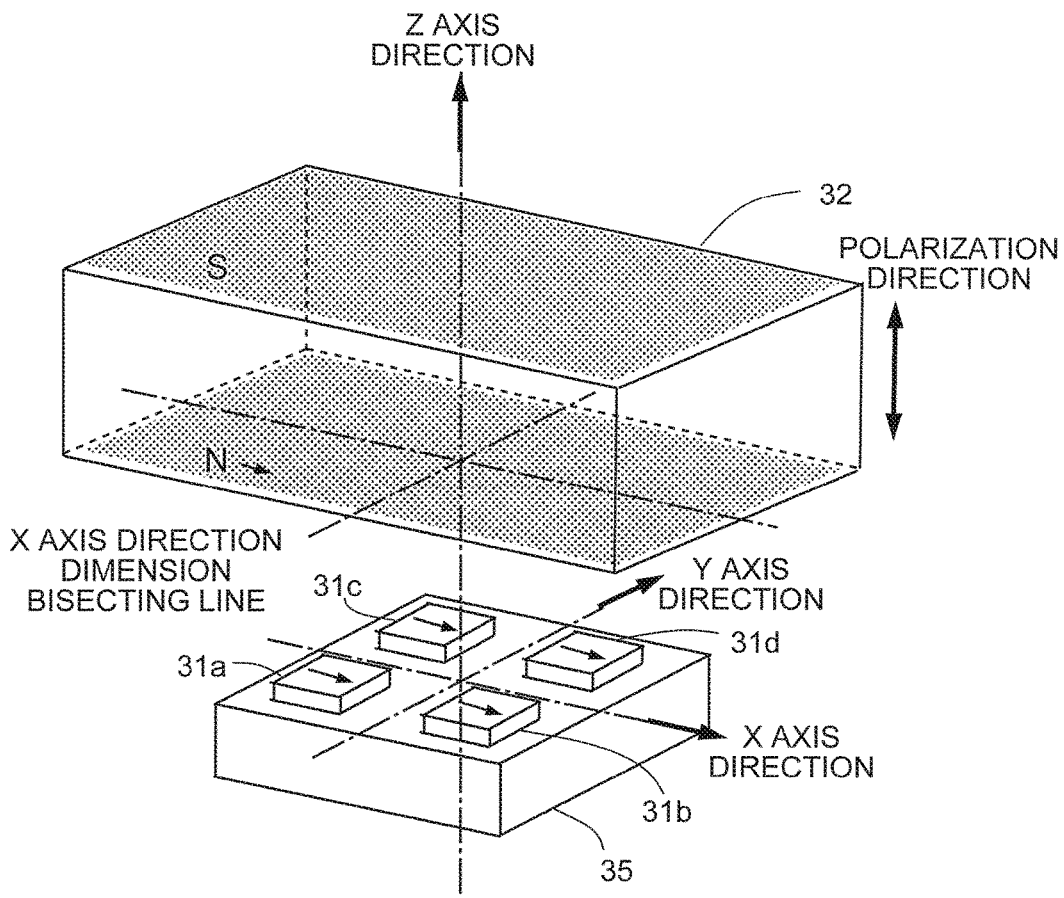
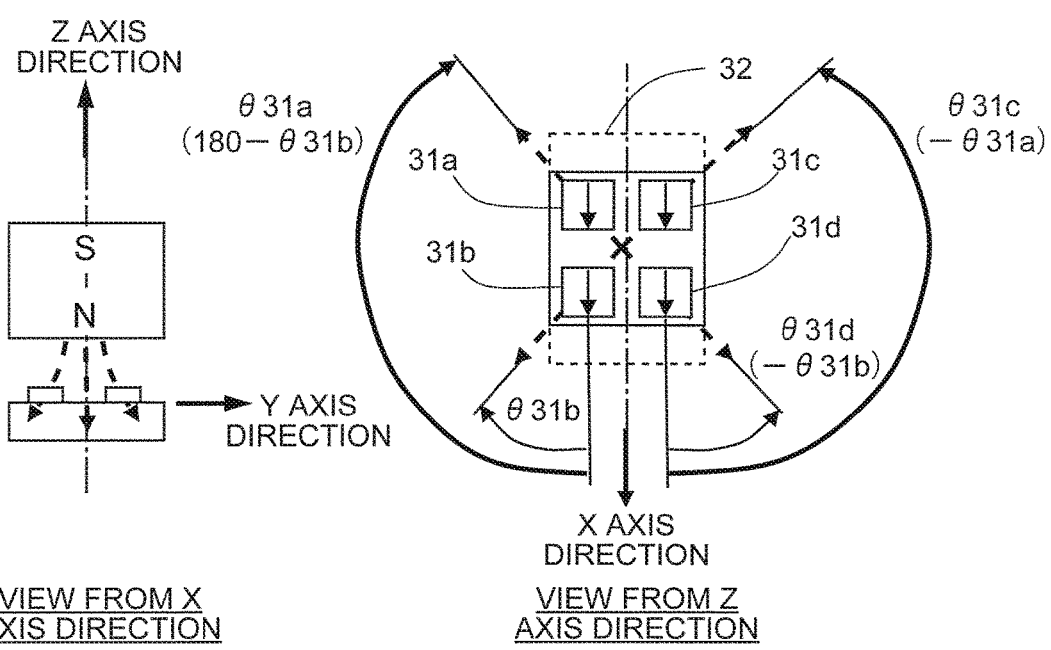
VIEW FROM X
AXIS DIRECTION
VIEW FROM Z
AXIS DIRECTION FIG. 45
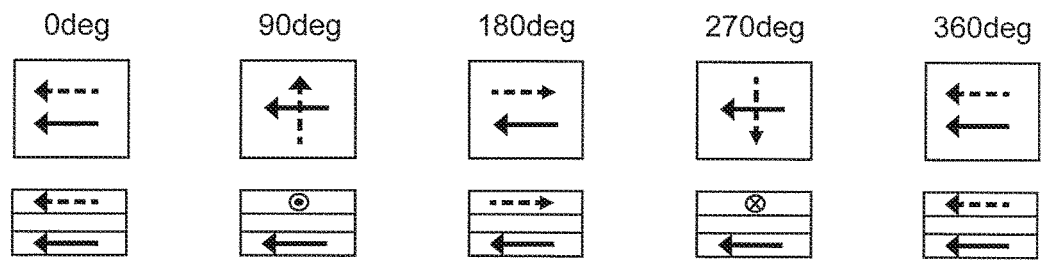
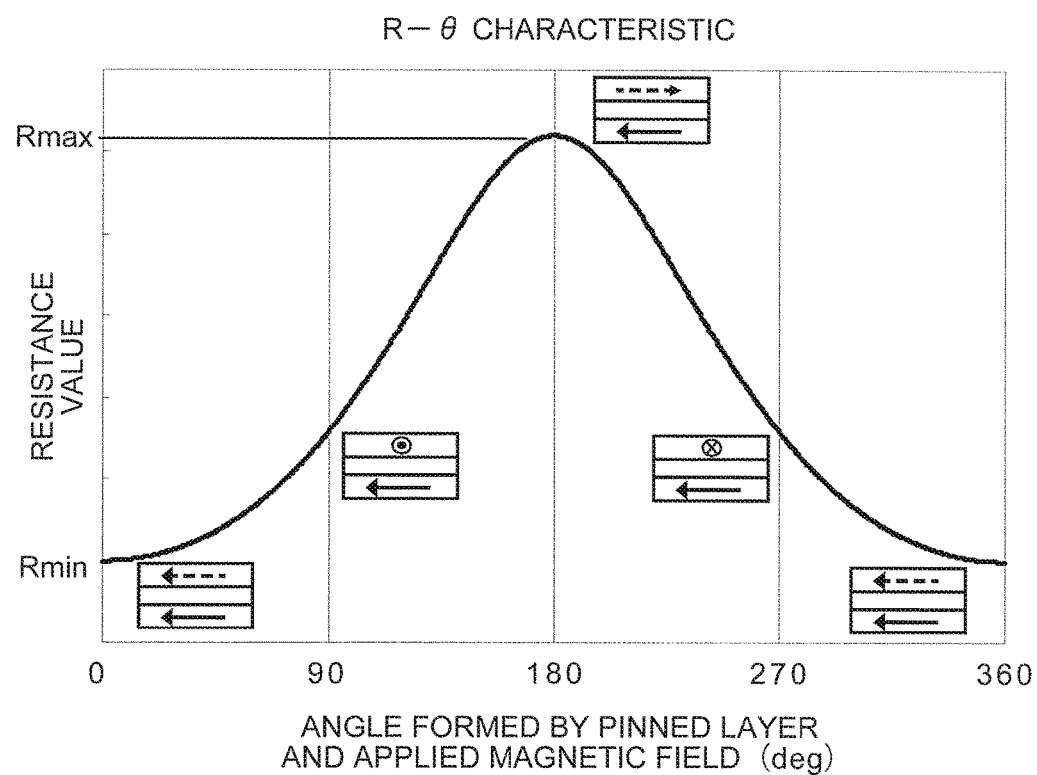

MAGNETIC DETECTION APPARATUS WITH A TUNNEL MAGNETORESISTIVE ELEMENT

CROSS REFERENCE TO RELATED APPLICATIONS

This application is a National Stage of International Application No. PCT/JP2013/078332filed Oct. 18, 2013, the contents of which are incorporated herein by reference in their entirety.

TECHNICAL FIELD

This invention relates to a magnetic detection apparatus that is capable of detecting irregularities on a magnetic moving body from variation in an external magnetic field applied to a magnetoresistive element.

BACKGROUND ART

A TMR element (a tunnel magnetoresistive element) that generates resistance change in response to an applied magnetic field using a tunnel effect has recently come into use as a magnetoresistive element for detecting irregularities on a magnetic moving body. Here, the TMR element is formed with a pinned layer constituted by a ferromagnet and having a fixed magnetization direction, a tunnel film constituted by an insulating layer, and a free layer constituted by a ferromagnet and having a magnetization direction that varies freely in response to an external magnetic field.

FIG. 44 is a view showing an R-H characteristic of a TMR element. More specifically, FIG. 44 shows resistance change occurring when an external magnetic field parallel to the magnetization direction of the pinned layer of the TMR element is applied. When a parallel magnetic field of a certain value or more is applied in the magnetization direction of the pinned layer, as shown in FIG. 44, a resistance value of the TMR changes to a minimum and is thus saturated. Further, when an antiparallel magnetic field of a certain value or more is applied, the resistance value of the TMR changes to a maximum and is thus saturated. FIG. 45 is a view showing an R-θ characteristic of the TMR element. More specifically, FIG. 45 shows resistance change occurring when the magnetic field that saturates the resistance value in FIG. 44 is applied to the TMR element and an angle thereof relative to the magnetization direction of the pinned layer is varied. As shown in FIG. 45, when 360 deg is set as a single period, the resistance value changes in accordance with an angle formed by the magnetization direction of the pinned layer and the direction of the applied magnetic field (the magnetization direction of the free layer).

As is evident from FIG. 45, with regard to a magnetic detection apparatus that uses resistance value change corresponding to variation in the angle formed by the pinned layer magnetization direction and the free layer magnetization direction, use is preferred with an angle in the vicinity of 90 deg, where the resistance change corresponding to the formed angle is greatest. A direction of a bias magnetic field applied to the TMR element at or above the saturation magnetic field (i.e. the magnetization direction of the free layer) is therefore set in the vicinity of 90 deg relative to the magnetization direction of the pinned layer.

FIG. 46 is a view showing a magnetic circuit configuration of a conventional magnetic detection apparatus employing a TMR element. Further, FIG. 47 is a partially enlarged view of the magnetic circuit configuration shown in FIG. 46.

FIG. 46 shows a TMR element 1, a magnet 2, a magnetic moving body 3 shaped so as to induce magnetic field change, and a rotary shaft 4. When the rotary shaft 4 rotates, the magnetic moving body 3 rotates synchronously therewith. FIG. 47 also shows an IC 5 including a circuit board or a processing circuit on which the TMR element is mounted.

When the magnetization direction of the pinned layer of the TMR element 1 is set as an X axis direction, a direction perpendicular to the X axis direction and perpendicular to a pinned layer plane is set as a Z axis direction, and a direction perpendicular to an XZ plane is set as a Y axis direction, the magnetic moving body 3 is disposed on one side of the TMR element 1 in the Y axis direction so as to move substantially parallel to the X axis direction. The magnet 2 is disposed on an opposite side of the TMR element 1 to the magnetic moving body 3 in the Y axis direction. The magnet 2 is polarized in the Y axis direction so as to apply a magnetic field to the TMR element at an angle of substantially 90 deg relative to the magnetization direction of the pinned layer of the TMR element 1.

FIG. 48 is an illustrative view relating to the angle of the magnetic field applied to the TMR element by the conventional magnetic detection apparatus, and shows the angle of the magnetic field applied to the TMR element when the magnetic moving body 3 rotates. FIG. 48A shows a point at which one side of a projection on the magnetic moving body 3, in the X axis direction, is close to the TMR element, FIG. 48B shows a point at which the projection on the magnetic moving body 3 opposes the TMR element in the Y axis direction, and FIG. 48C shows a point at which the other side of the projection on the magnetic moving body 3, in the X axis direction, is close to the TMR element.

FIG. 49 is a view showing variation in the angle of the magnetic field applied to the TMR element by the conventional magnetic detection apparatus. More specifically, FIG. 49 shows a result of a magnetic field simulation simulating variation in the angle of the magnetic field applied to the TMR element corresponding to irregularities appearing as the magnetic moving body 3 rotates. Further, FIG. 50 is a view showing the R-θ characteristic of the TMR element provided in the conventional magnetic detection apparatus, and shows resistance change generated in response to variation in the angle of the applied magnetic field, as shown in FIG. 49. Furthermore, FIG. 51 is a view showing resistance change in the TMR element provided in the conventional magnetic detection apparatus. More specifically, FIG. 51 shows resistance change in the TMR element corresponding to the irregularities on the magnetic moving body 3, which is obtained by varying the angle of the applied magnetic field as shown in FIG. 49.

Further, FIG. 52 is a view of a circuit used in the conventional magnetic detection apparatus to process the resistance change occurring in the TMR element. FIG. 53 is a view showing an operation waveform generated by the conventional magnetic detection apparatus, and shows a differential output voltage and a final output corresponding to the irregularities on the magnetic moving body 3, which are obtained by the circuit shown in FIG. 52. The processing circuit shown in FIG. 52 is capable of generating a final output signal that reverses at a projecting portion center and a recessed portion center of the magnetic moving body 3 by comparing the differential output voltage shown in FIG. 53 with a reference voltage Vref (see PTL 1, for example).

CITATION LIST

Patent Literature

[PTL1]
Japanese Patent Application Publication No. 2001-217478

SUMMARY OF INVENTION

Technical Problem

However, the prior art includes the following problem.

The detection precision of the magnetic circuit provided in the conventional magnetic detection apparatus shown in FIGS. 46 and 47 can be improved by increasing the amount of variation in the angle of the magnetic field applied to the TMR element corresponding to the irregularities on the magnetic moving body, as shown in FIG. 49. In other words, the problem is how best to increase the amount of variation in the angle of the magnetic field applied to the TMR element in order to improve the detection precision.

This invention has been designed to solve the problem described above, and an object thereof is to obtain a magnetic detection apparatus with which an amount of variation in an angle of a magnetic field applied to a TMR element can be increased in comparison with a conventional apparatus, enabling an improvement in detection precision.

Solution to Problem

A magnetic detection apparatus according to this invention includes an element having a magnetic tunnel junction structure configured such that an insulating layer is sandwiched between a pinned layer having a fixed magnetization direction and a free layer having a magnetization direction that varies freely, a magnet disposed in order to apply a magnetic field to the element, and a rotating magnetic moving body having an irregular shape that induces change in the magnetic field. When, using the element as a reference, the magnetization direction of the pinned layer is set as an X axis direction, a direction perpendicular to the X axis direction and perpendicular to a plane of the pinned layer is set as a Z axis direction, and a direction perpendicular to an XZ plane constituted by the X axis direction and the Z axis direction is set as a Y axis direction, the magnetic moving body, which is disposed opposite the element in the Y axis direction via a gap relative to the element, rotates about a rotary shaft such that a part thereof disposed opposite the element moves in a parallel direction to the X axis direction, whereby the magnetic detection apparatus detects the irregular shape of the part disposed opposite the element from a magnetic resistance that varies as the magnetic moving body rotates. In the magnetic detection apparatus, the magnet is polarized in the Z axis direction, and disposed in the Z axis direction via a gap relative to the element.

Advantageous Effects of Invention

According to this invention, the amount of variation in the angle of the magnetic field applied to the TMR element can be increased in comparison with a conventional apparatus by disposing the magnet in the Z axis direction (a direction perpendicular to the magnetization direction of the pinned layer of the element and perpendicular to the pinned layer plane) relative to the element, and as a result, the detection precision can be improved.

BRIEF DESCRIPTION OF DRAWINGS

FIG. 9 is a partially enlarged view of a magnetic circuit configuration according to a second embodiment of this invention.

FIG. 20 is a partially enlarged view of a magnetic circuit configuration according to a fourth embodiment of this invention.

FIG. 28 is a partially enlarged view of a magnetic circuit configuration according to a fifth embodiment of this invention.

FIG. 45 is a view showing an R-θ characteristic of the TMR element.

DESCRIPTION OF EMBODIMENTS

Preferred embodiments of a magnetic detection apparatus according to this invention will be described below using the drawings.

First Embodiment

Figure 1:
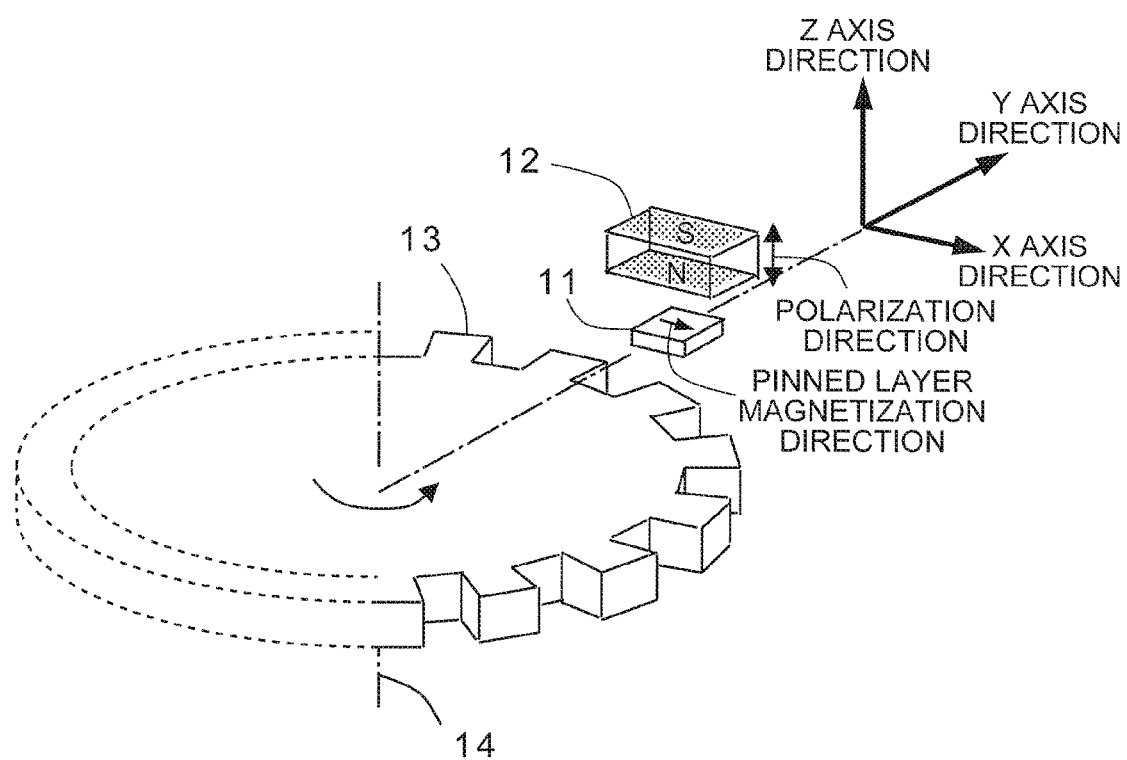
FIG. 1 is a view showing a magnetic circuit configuration of a magnetic detection apparatus according to a first embodiment of this invention.
Figure 2:
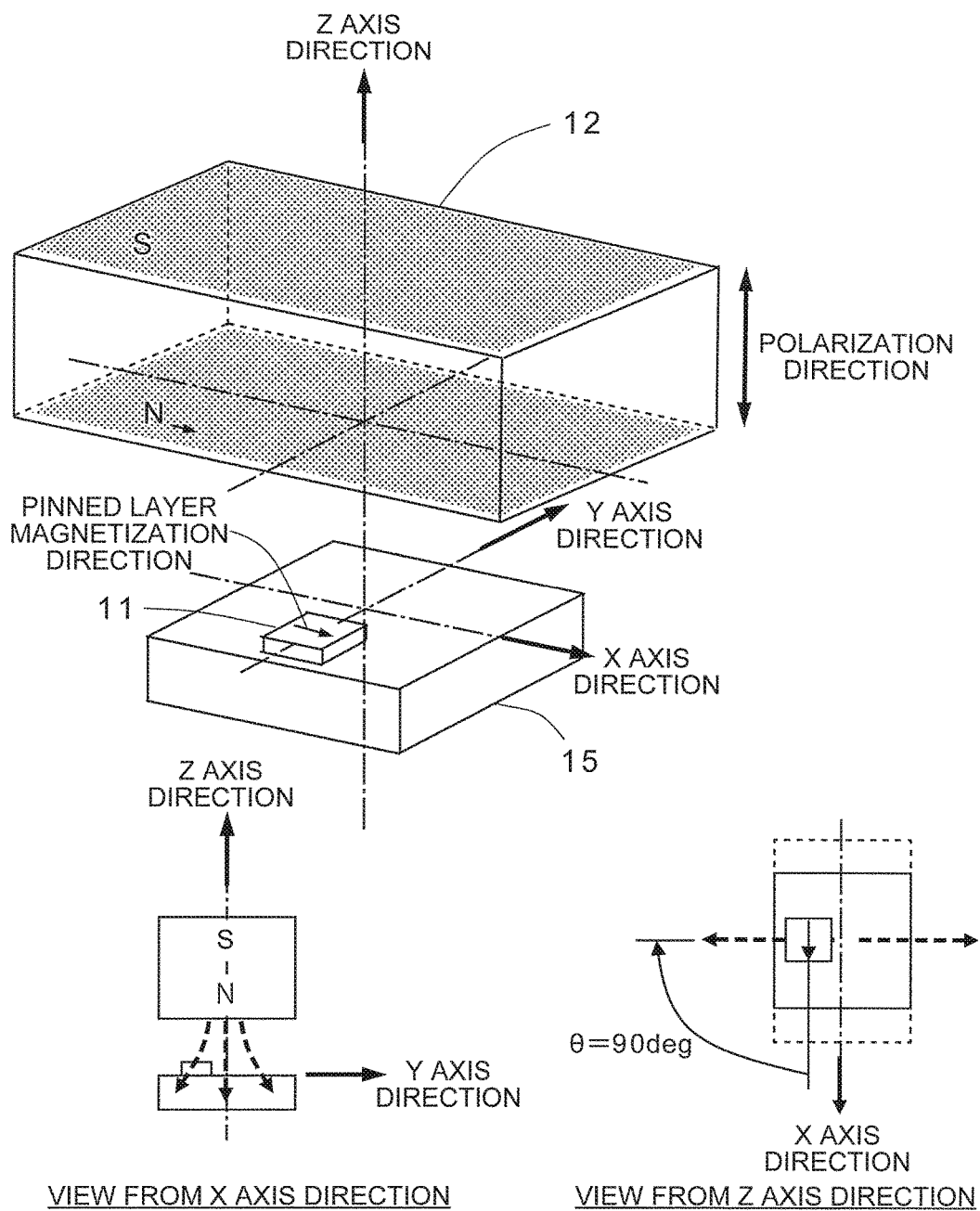
FIG. 2 is a partially enlarged view of the magnetic circuit configuration shown in FIG. 1, according to the first embodiment of this invention.

FIG. 1 is a view showing a magnetic circuit configuration of a magnetic detection apparatus according to a first embodiment of this invention. Further, FIG. 2 is a partially enlarged view of the magnetic circuit configuration shown in FIG. 1, according to the first embodiment of this invention. FIG. 1 shows a TMR element 11, a magnet 12, a magnetic moving body 13 shaped so as to induce magnetic field change, and a rotary shaft 14. When the rotary shaft 14 rotates, the magnetic moving body 13 rotates synchronously therewith. FIG. 2 also shows an IC 15 including a circuit board or a processing circuit on which the TMR element 11 is mounted.

When a magnetization direction of a pinned layer of the TMR element 11 is set as an X axis direction, a direction perpendicular to the X axis direction and perpendicular to a pinned layer plane is set as a Z axis direction, and a direction perpendicular to an XZ plane is set as a Y axis direction, the magnetic moving body 13 is disposed on one side of the TMR element 11 in the Y axis direction so as to move substantially parallel to the X axis direction. The magnet 12 is disposed in the Z axis direction relative to the TMR element 11, and is polarized in the Z axis direction. A magnetic field component that is parallel to an XY plane is configured to be applied to the TMR element 11 at 90 deg relative to the magnetization direction of the pinned layer.

Figure 3A:
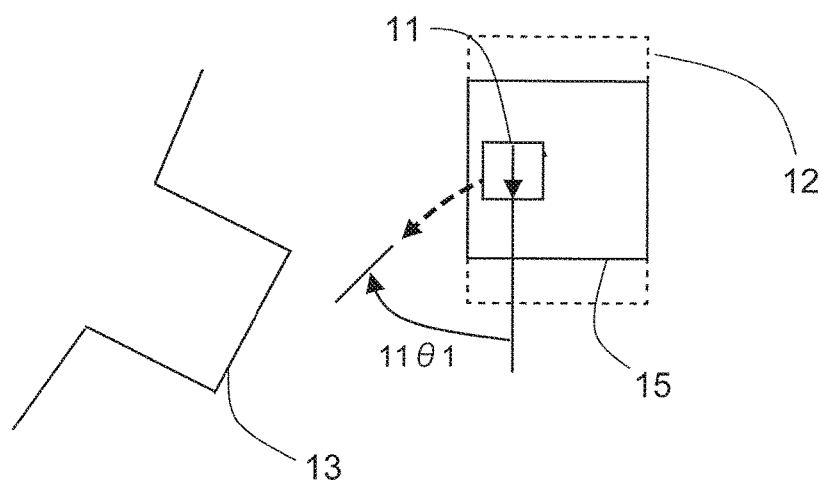
FIG. 3A is an illustrative view relating to an angle of a magnetic field applied to a TMR element provided in the magnetic detection apparatus according to the first embodiment of this invention.
Figure 3B:
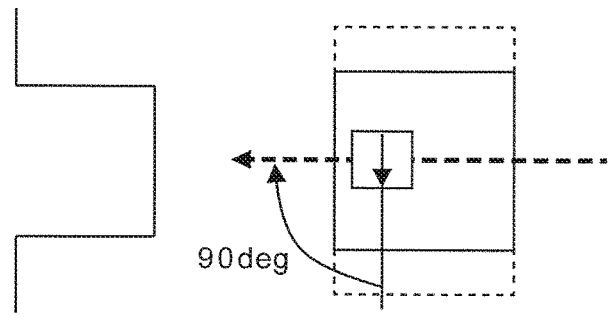
FIG. 3B is an illustrative view relating to an angle of a magnetic field applied to a TMR element provided in the magnetic detection apparatus according to the first embodiment of this invention.
Figure 3C:
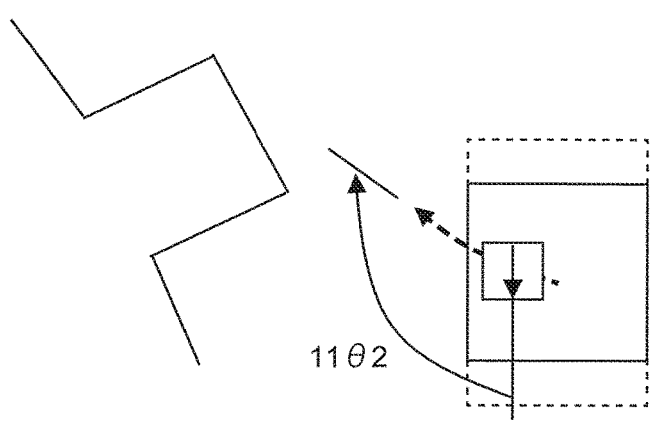
FIG. 3C is an illustrative view relating to an angle of a magnetic field applied to a TMR element provided in the magnetic detection apparatus according to the first embodiment of this invention.
Figure 4:
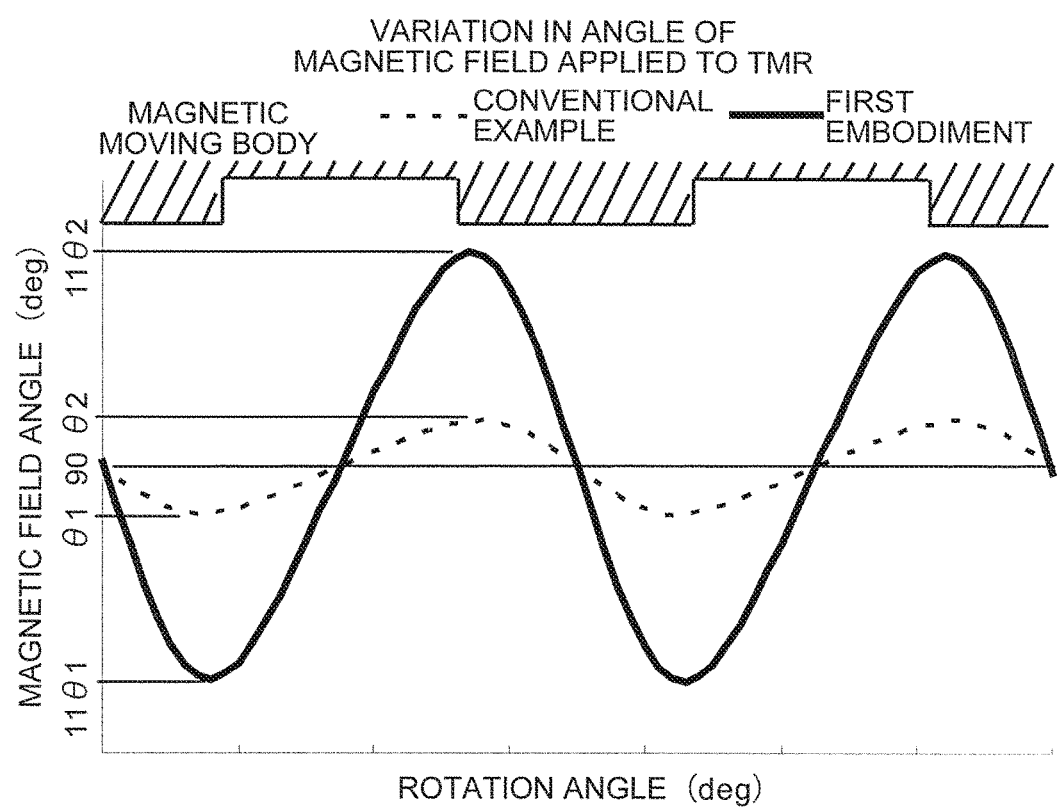
FIG. 4 is a view showing variation in the angle of the magnetic field applied to the TMR element provided in the magnetic detection apparatus according to the first embodiment of this invention.

FIG. 3 is an illustrative view relating to an angle of a magnetic field applied to the TMR element provided in the magnetic detection apparatus according to the first embodiment of this invention, and shows the angle of the magnetic field applied to the TMR element 11 when the magnetic moving body 13 rotates. FIG. 3A shows a point at which one side of a projection on the magnetic moving body 13, in the X axis direction, is close to the TMR element, FIG. 3B shows a point at which the projection on the magnetic moving body 13 opposes the TMR element in the Y axis direction, and FIG. 3C shows a point at which the other side of the projection on the magnetic moving body 13, in the X axis direction, is close to the TMR element. FIG. 4 is a view showing variation in the angle of the magnetic field applied to the TMR element provided in the magnetic detection apparatus according to the first embodiment of this invention. More specifically, FIG. 4 shows a result of a magnetic field simulation simulating variation in the angle of the magnetic field applied to the TMR element 11 corresponding to irregularities appearing as the magnetic moving body 13 rotates.

Figure 5:
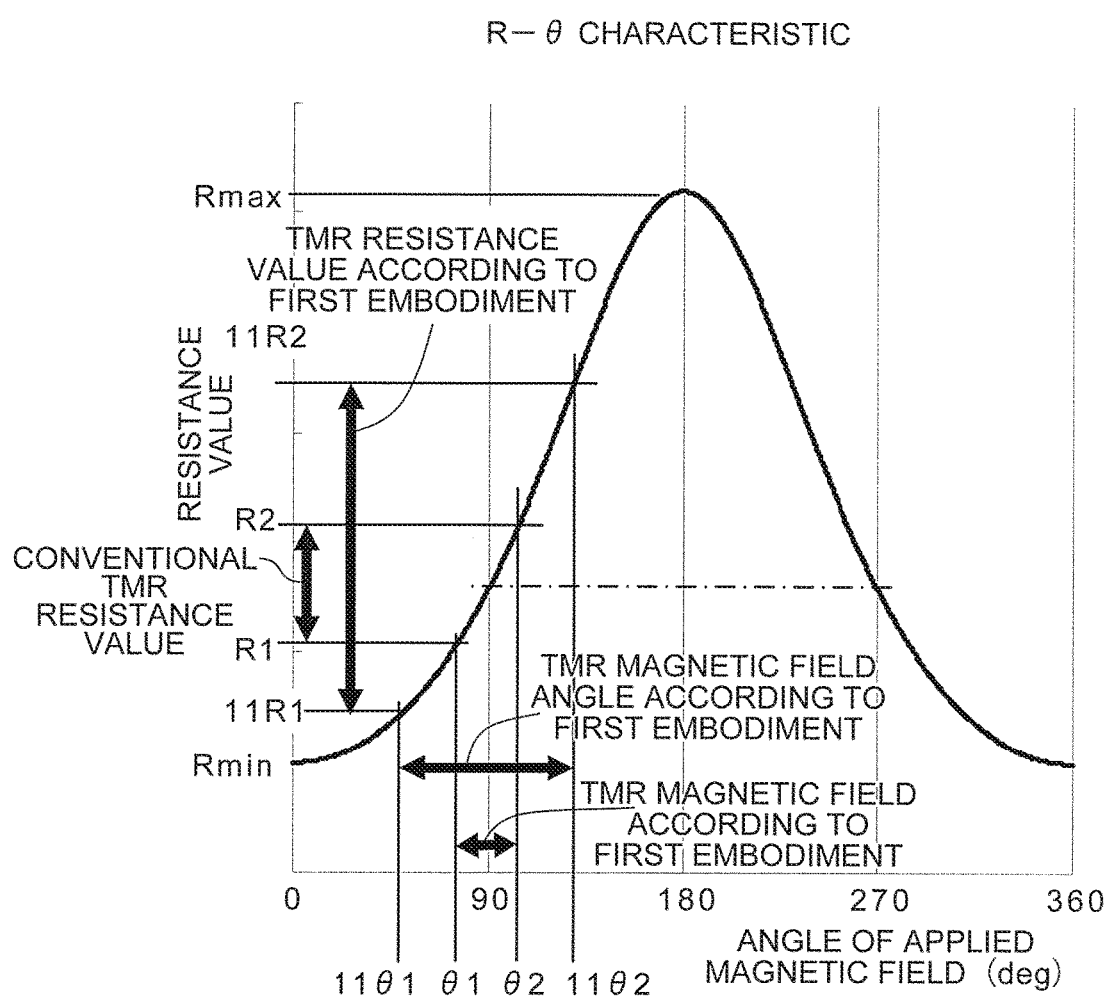
FIG. 5 is a view showing an R-θ characteristic of the TMR element provided in the magnetic detection apparatus according to the first embodiment of this invention.
Figure 6:
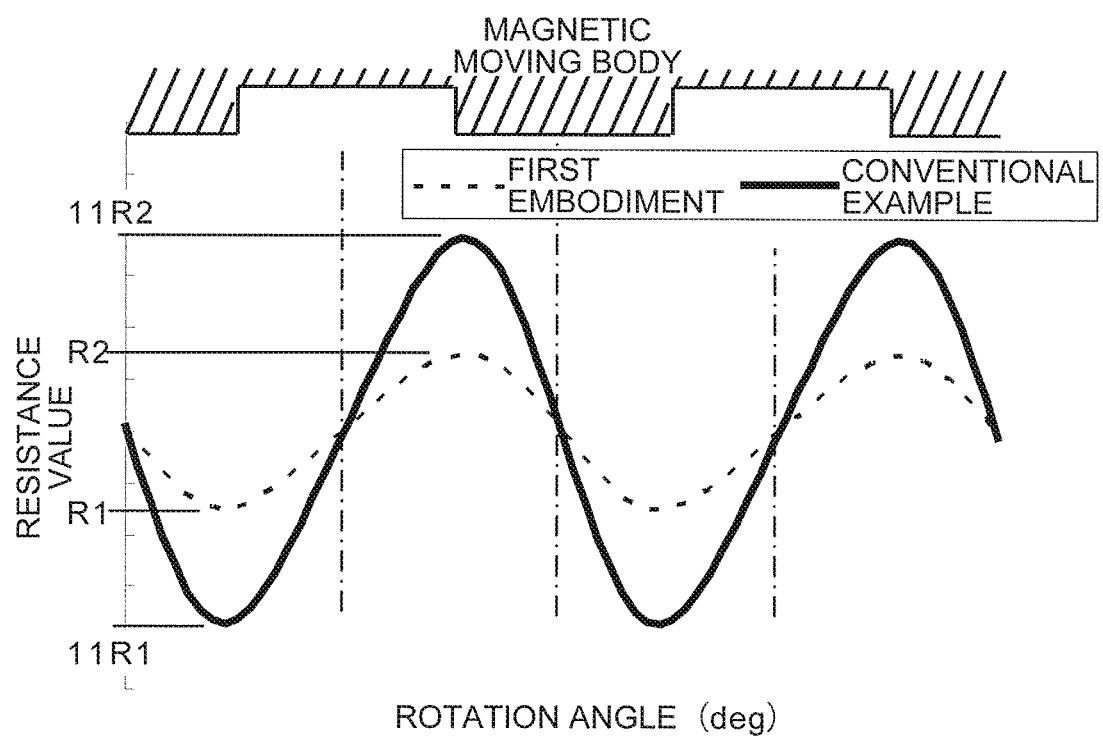
FIG. 6 is a view showing resistance change in the TMR element provided in the magnetic detection apparatus according to the first embodiment of this invention.

Further, FIG. 5 is a view showing an R-θ characteristic of the TMR element provided in the magnetic detection apparatus according to the first embodiment of this invention, and shows resistance change generated in response to variation. in the angle of the applied magnetic field, as shown in FIG. 4. Furthermore, FIG. 6 is a view showing resistance change in the TMR element provided in the magnetic detection apparatus according to the first embodiment of this invention. More specifically, FIG. 6 shows resistance change in the TMR element corresponding to the irregularities on the magnetic moving body 13, which is obtained by varying the angle of the applied magnetic field as shown in FIG. 4.

Note that in FIGS. 4 and 6, a solid line shows a waveform obtained by the magnetic detection apparatus according to the first embodiment, while a dotted line shows a waveform obtained by the conventional magnetic detection apparatus.

In the magnetic circuit configuration according to the first embodiment, as shown in FIG. 4, an amplifier of the angle of the magnetic field applied to the TMR element 11 is much larger than that of the conventional magnetic circuit configuration. Therefore, resistance change such as that shown in FIG. 5 is generated by the magnetic detection apparatus according to the first embodiment, and as a result, as shown in FIG. 6, resistance change having a larger amplifier than that of the conventional magnetic detection apparatus can be obtained in the TMR element in response to the irregularities on the magnetic moving body 13.

Figure 7:
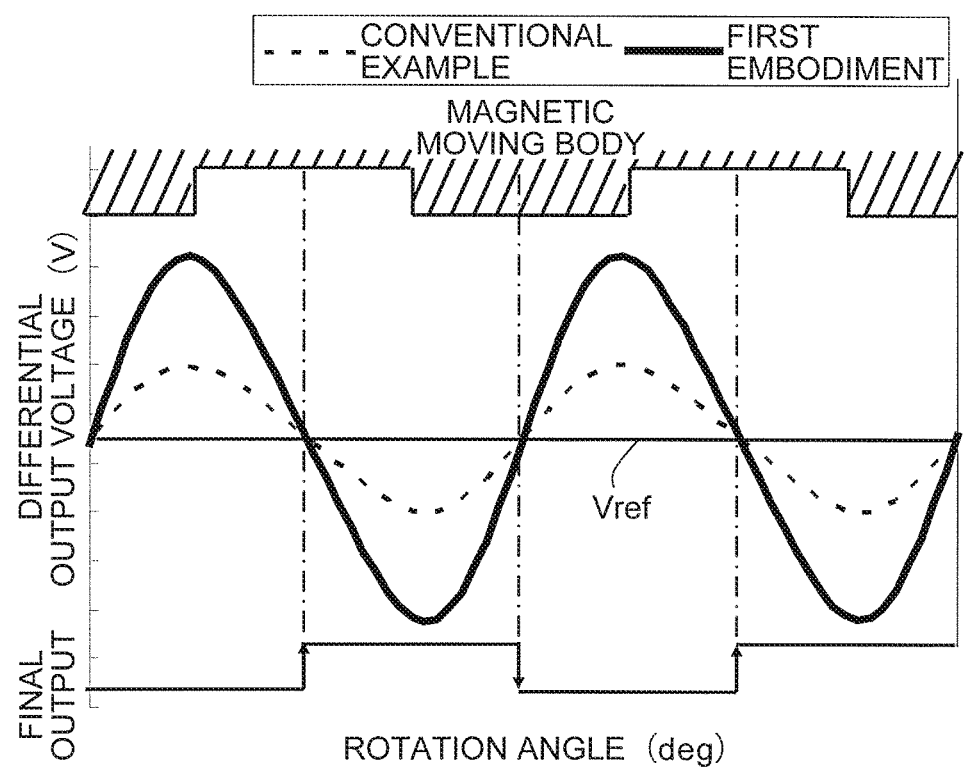
FIG. 7 is a view showing an operation waveform generated by the magnetic detection apparatus according to the first embodiment of this invention.
Figure 52:
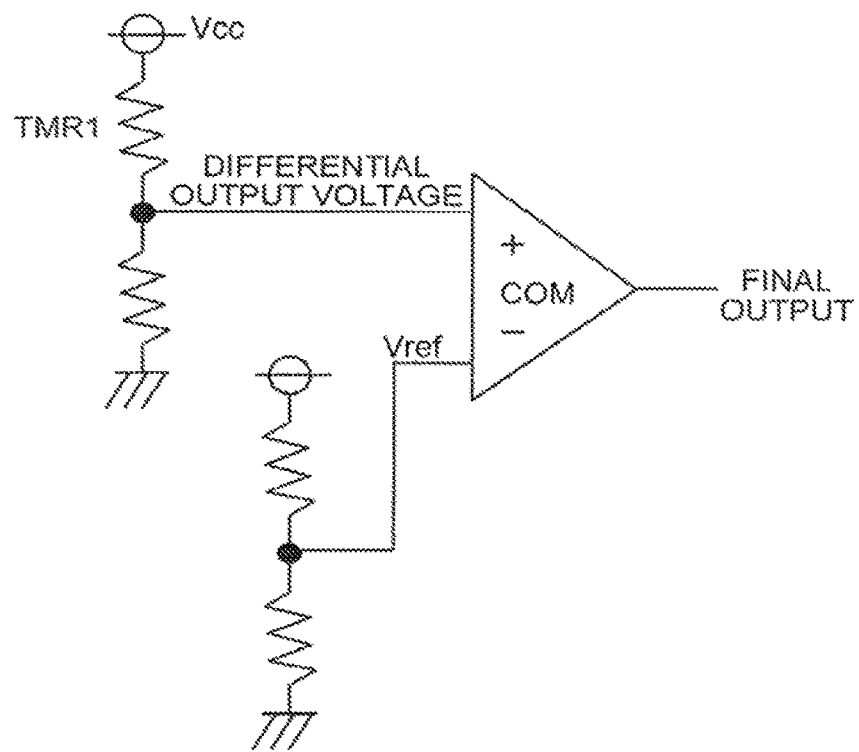
FIG. 52 is a view of a circuit used by the conventional magnetic detection apparatus to process the resistance change in the TMR element.
Figure 53:
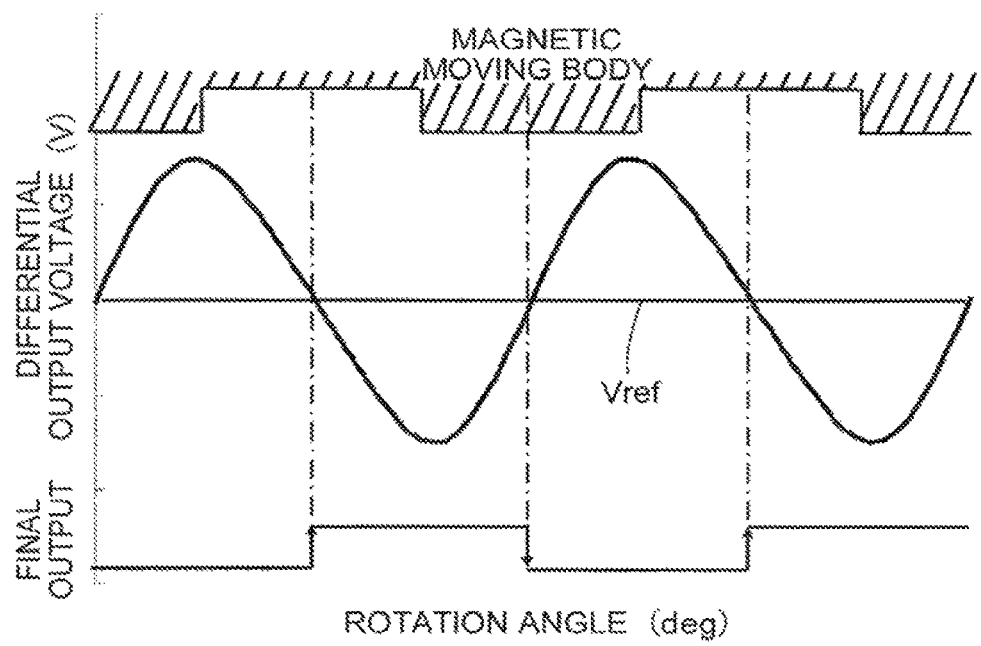
FIG. 53 is a view showing an operation waveform generated by the conventional magnetic detection apparatus.

Further, FIG. 7 is a view showing an operation waveform generated by the magnetic detection apparatus according to the first embodiment of this invention, and shows a differential output voltage and a final output corresponding to the irregularities on the magnetic moving body 3, which are obtained by the circuit shown in FIG. 52, described above. Note that in FIG. 7, a solid line shows a waveform obtained by the magnetic detection apparatus according to the first embodiment, while a dotted line shows a waveform obtained by the conventional magnetic detection apparatus.

The magnetic detection apparatus according to the first embodiment performs signal processing using a similar circuit to the conventional circuit shown in FIG. 52. As shown in FIG. 7, however, a differential output voltage having a larger amplifier than that of the conventional magnetic detection apparatus can be obtained in response to the irregularities on the magnetic moving body 13. Therefore, a final output signal that reverses at a projecting portion center and a recessed portion center of the magnetic moving body 13, the final output signal being obtained by comparing the differential output voltage with a reference voltage Vref, takes a more precise value than that of the conventional magnetic detection apparatus.

According to the first embodiment, as described above, a magnetic circuit is configured by disposing the magnet in the Z axis direction (in other words, the direction perpendicular to the magnetization direction of the pinned layer of the TMR element and perpendicular to the pinned layer plane) relative to the TMR element. As a result, a magnetic detection apparatus with which a final output signal can be obtained by increasing the amount of variation in the angle of the magnetic field applied to the TMR element, enabling an improvement in detection precision, can be realized.

Second Embodiment

In the first embodiment, a case in which a single TMR element is mounted on the IC was described. In a second embodiment, on the other hand, a case in which the detection precision is improved even further by mounting two or more TMR elements will be described.

Figure 8:
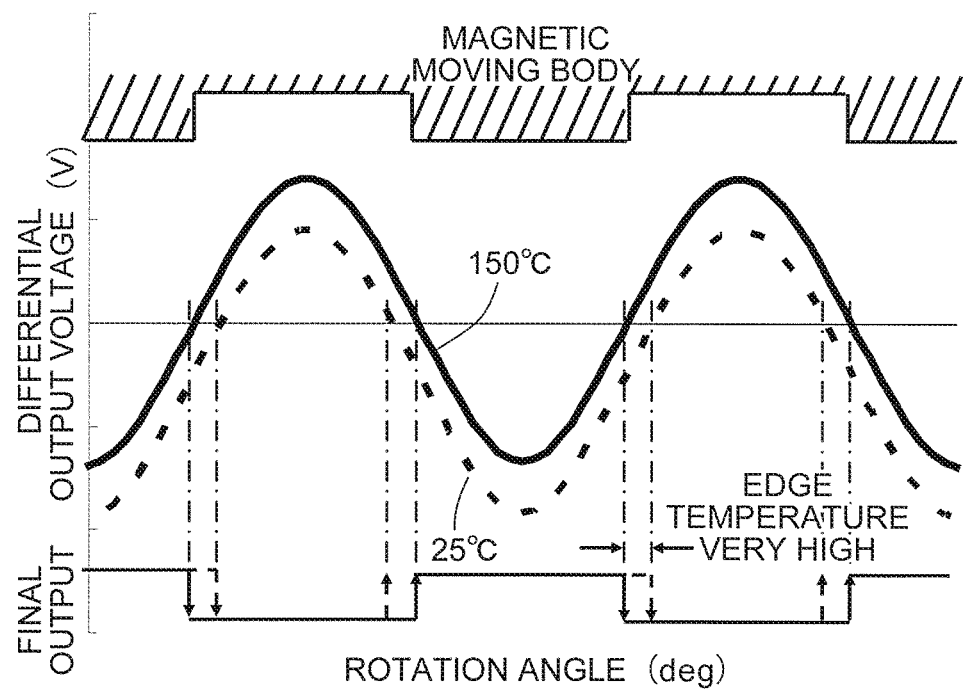
FIG. 8 is a view showing a temperature dependence of the operation waveform generated by the magnetic detection apparatus according to the first embodiment of this invention.

FIG. 8 is a view showing a temperature dependence of the operation waveform generated by the magnetic detection apparatus according to the first embodiment of this invention, described above. More specifically, a dotted line shows the waveform of the differential output voltage shown in FIG. 7 when a temperature of the detection circuit is 25° C., and a solid line shows the waveform when the temperature of the detection circuit is 150° C.

In the magnetic circuit configuration according to the first embodiment, shown in FIG. 2, a resistor that forms a bridge with the TMR element 11 is constituted by an element other than the TMR element 11. Accordingly, temperature coefficients of the resistance values thereof do not match, and therefore, as shown in FIG. 8, a temperature offset occurs in the differential output voltage, with the result that the final output likewise shifts according to the temperature. Hence, in the second embodiment, a specific configuration for solving the problem of this temperature offset will be described.

FIG. 9 is a partially enlarged view of a magnetic circuit configuration according to the second embodiment of this invention. FIG. 9 shows two TMR elements 21a, 21b, a magnet 22, and an IC 25 including a circuit board or a processing circuit on which the TMR elements 21a, 21b are mounted. In the magnetic circuit configuration according to the second embodiment, a bridge circuit is configured by disposing two or more TMR elements side by side in the Y axis direction on either side of a plane constituted by the Z axis direction and a line (corresponding to a "Y axis direction dimension bisecting line" in FIG. 9) that is parallel to the X axis direction and bisects a Y axis direction dimension of the magnet 22 in FIG. 1, i.e. the view showing the magnetic circuit configuration according to the first embodiment. FIG. 9 shows an example of a case in which the two TMR elements 21a, 21b are disposed side by side.

As shown in FIG. 9, bias magnetic fields are applied respectively to the TMR element 21a and the TMR element 21b at θ21a=90 deg and θ21b=−90 deg (270 deg) relative to the magnetization directions of the pinned layers of the TMR elements.

Figure 10A:
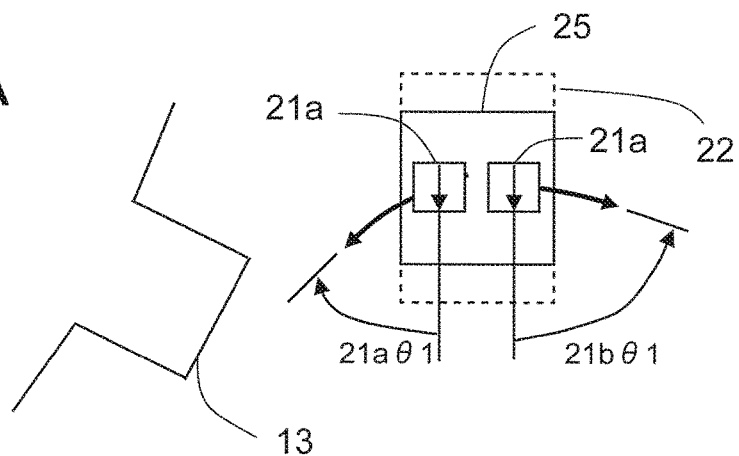
FIG. 10A is an illustrative view relating to angles of magnetic fields applied respectively to TMR elements provided in a magnetic detection apparatus according to the second embodiment of this invention.
Figure 10B:
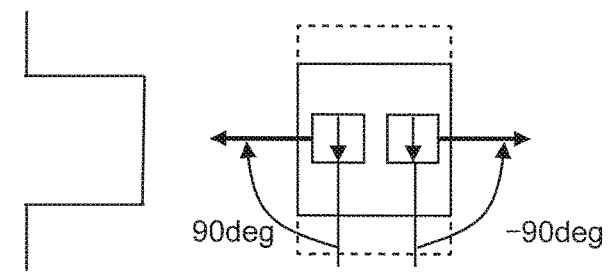
FIG. 10B is an illustrative view relating to angles of magnetic fields applied respectively to TMR elements provided in a magnetic detection apparatus according to the second embodiment of this invention.
Figure 10C:
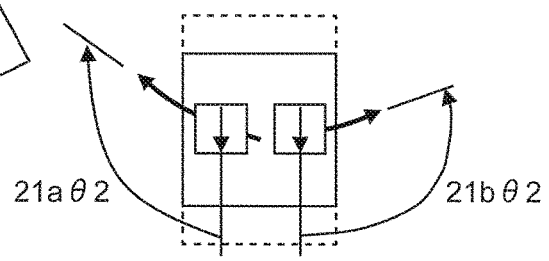
FIG. 10C is an illustrative view relating to angles of magnetic fields applied respectively to TMR elements provided in a magnetic detection apparatus according to the second embodiment of this invention.

FIG. 10 is an illustrative view relating to the angles of the magnetic fields applied respectively to the TMR elements provided in the magnetic detection apparatus according to the second embodiment of this invention, and shows the magnetic fields applied to the TMR elements 21a, 21b as the magnetic moving body 13 rotates. FIG. 10A shows a point at which one side of the projection on the magnetic moving body 13, in the X axis direction, is close to the TMR element, FIG. 10B shows a point at which the projection on the magnetic moving body 13 opposes the TMR. element in the Y axis direction, and FIG. 10C shows a point at which the other side of the projection on the magnetic moving body 13, in the X axis direction, is close to the TMR element.

Figure 11:
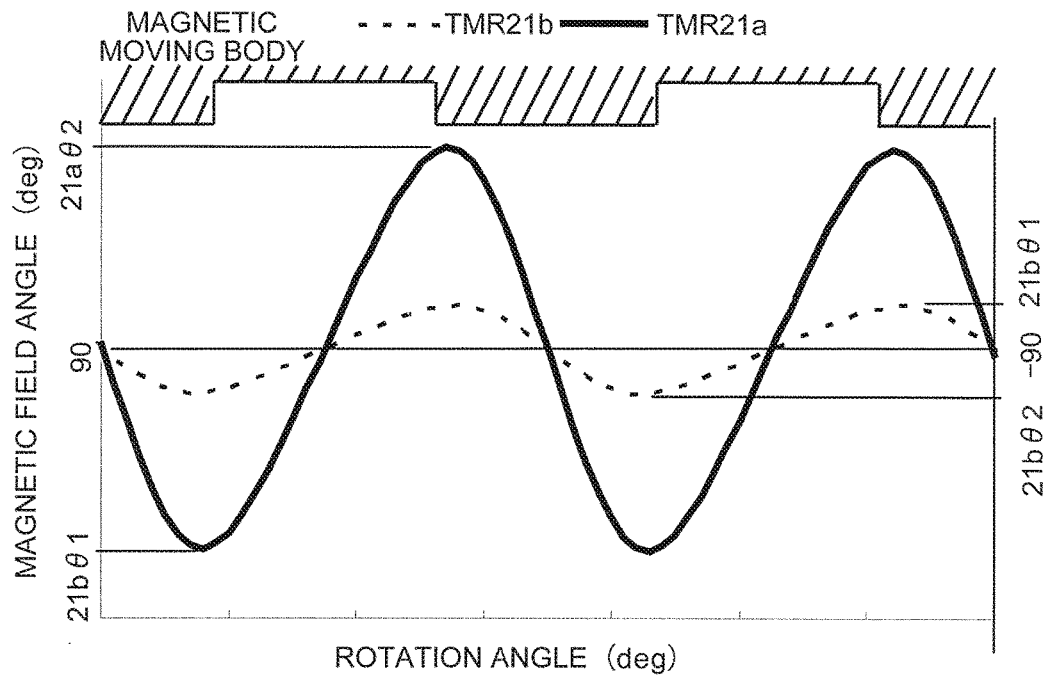
FIG. 11 is a view showing variation in the angles of the magnetic fields applied respectively to the TMR elements provided in the magnetic detection apparatus according to the second embodiment of this invention.

FIG. 11 is a view showing variation in the angles of the magnetic fields applied respectively to the TMR elements provided in the magnetic detection apparatus according to the second embodiment of this invention. More specifically, FIG. 11 shows a result of a magnetic field simulation simulating variation in the angles at which the magnetic fields are applied to the TMR elements corresponding to the irregularities that appear as the magnetic moving body 13 rotates.

Figure 12:
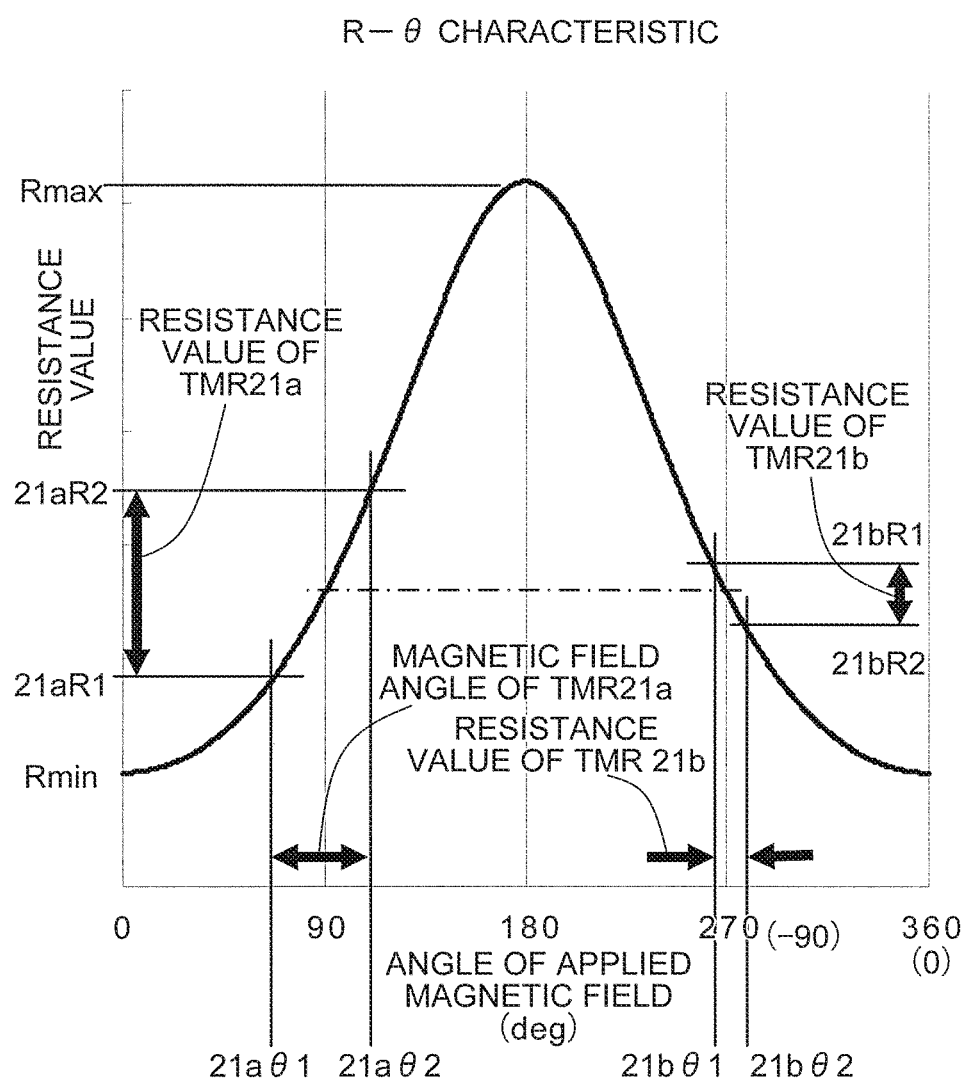
FIG. 12 is a view showing R-θ characteristics of the TMR elements provided in the magnetic detection apparatus according to the second embodiment of this invention.
Figure 13:
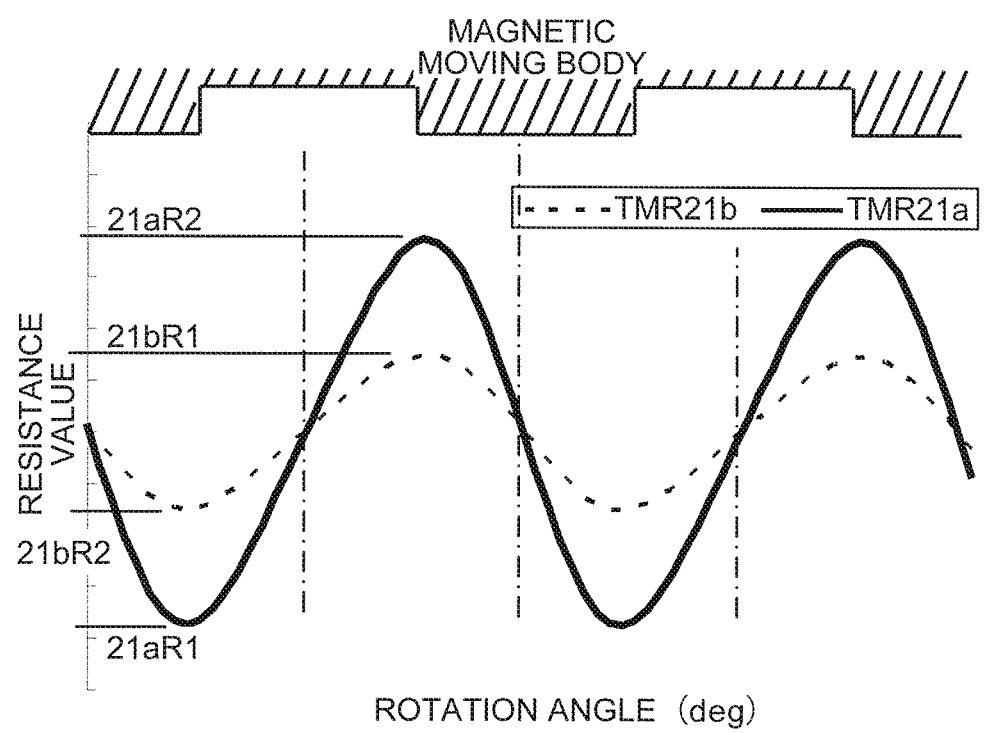
FIG. 13 is a view showing resistance change in the TMR elements provided in the magnetic detection apparatus according to the second embodiment of this invention.

Further, FIG. 12 is a view showing the R-θ characteristics of the TMR elements provided in the magnetic detection apparatus according to the second embodiment of this invention, and shows resistance change generated in response to variation in the angle of the applied magnetic field, as shown in FIG. 11. Furthermore, FIG. 13 is a view showing resistance change in the TMR elements provided in the magnetic detection apparatus according to the second embodiment of this invention. More specifically, FIG. 13 shows resistance change in the TMR elements corresponding to the irregularities on the magnetic moving body 13, which is obtained by varying the angles of the applied magnetic fields as shown in FIG. 11.

Note that in FIGS. 11 and 13, a solid line shows a waveform obtained by the first TMR element 21a, and a dotted line shows a waveform obtained by the second TMR element 21b.

Figure 14:
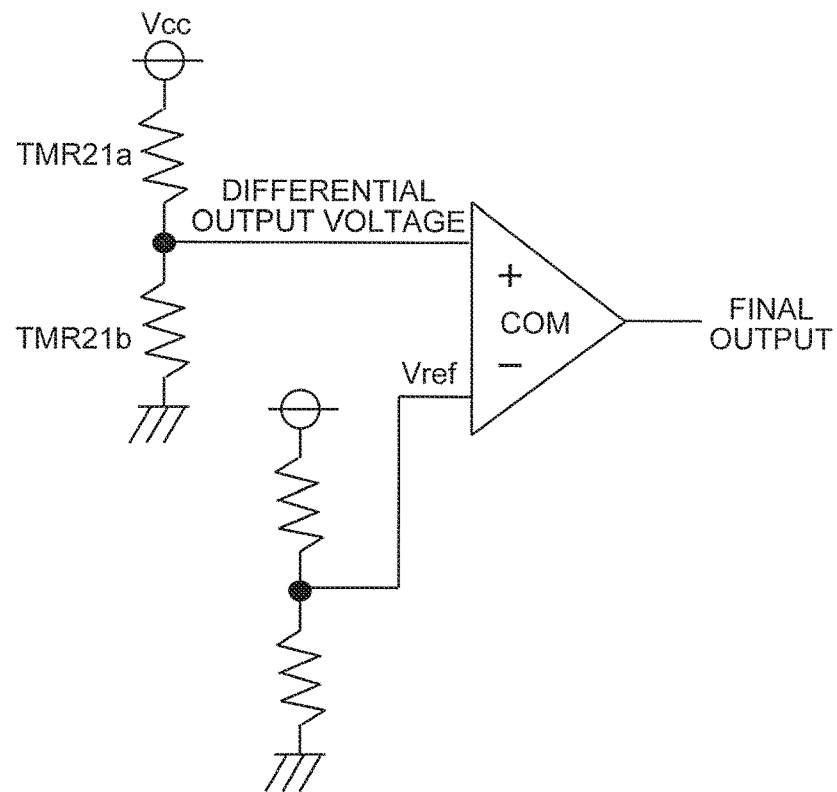
FIG. 14 is a view showing a circuit used by the magnetic detection apparatus according to the second embodiment of this invention to process the resistance change in the TMR elements.
Figure 15:
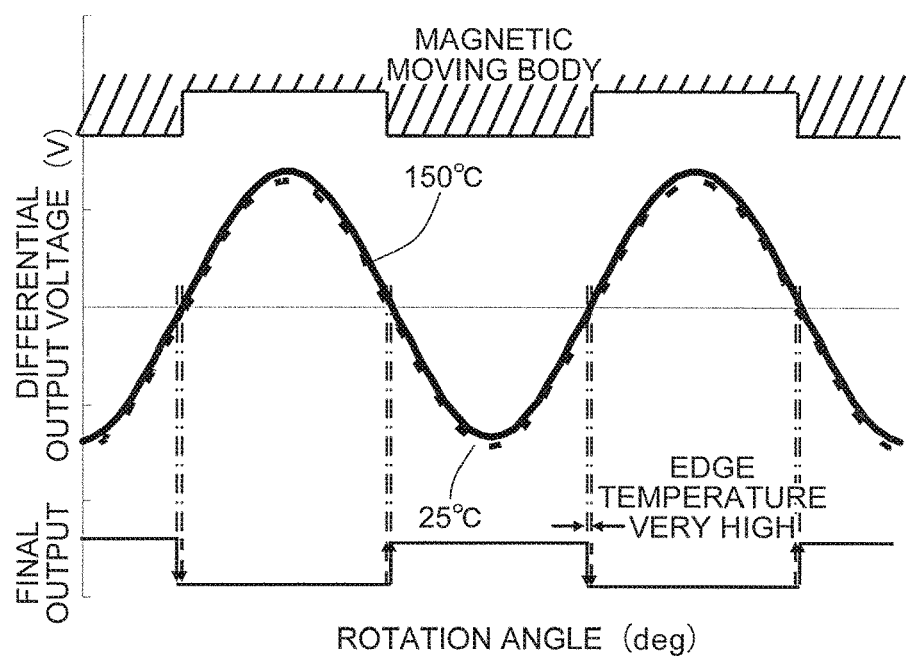
FIG. 15 is a view showing a temperature dependence of an operation waveform generated by the magnetic detection apparatus according to the second embodiment of this invention.

In the magnetic circuit configuration according to the second embodiment, as shown in FIG. 11, a deflection angle of the magnetic field applied to the TMR element 21a oscillates about 90 deg, while the deflection angle of the magnetic field applied to the TMR element 21b oscillates about −90 deg (270 deg), and therefore a magnetic field amplifier of TMR 21a>>TMR 21b is obtained. As shown in FIG. 12, therefore, the resistance value changes in accordance with this magnetic field amplifier, and as a result, as shown in FIG. 13, resistance change corresponding to the irregularities in the magnetic moving body 13 is obtained. FIG. 14 is a view showing a circuit used by the magnetic detection apparatus according to the second embodiment of this invention to process the resistance change in the TMR elements. Further, FIG. 15 is a view showing the temperature dependence of the operation waveform generated by the magnetic detection apparatus according to the second embodiment of this invention. More specifically, a dotted line shows the waveform of the differential output voltage generated by the first TMR element 21a, shown in FIG. 13, when the temperature of the detection circuit is 25° C., and a solid line shows the waveform when the temperature of the detection circuit is 150° C.

In the second embodiment, as shown in FIG. 14, the differential output voltage is generated by constructing a bridge from the TMR element 21a and the TMR element 21b. Therefore, as shown in FIG. 15, the temperature offset of the differential output voltage decreases such that variation in the final output due to temperature is reduced, and as a result, the final output is stabilized irrespective of the temperature.

According to the second embodiment, as described above, a plurality of TMR elements are used as the resistors of the bridge circuit that determines the differential output voltage. As a result, in addition to the effects of the first embodiment, a magnetic detection apparatus in which the temperature offset of the differential output voltage is reduced so that the detection precision is stabilized irrespective of the temperature of the IC can be realized.

Third Embodiment

In the second embodiment, a case in which the detection precision is stabilized. irrespective of the temperature by disposing the two TMR elements 21a, 21b in appropriate positions on the IC was described. In a third embodiment, meanwhile, optimum positions of the two TMR elements 21a, 21b will be described.

Figure 16:
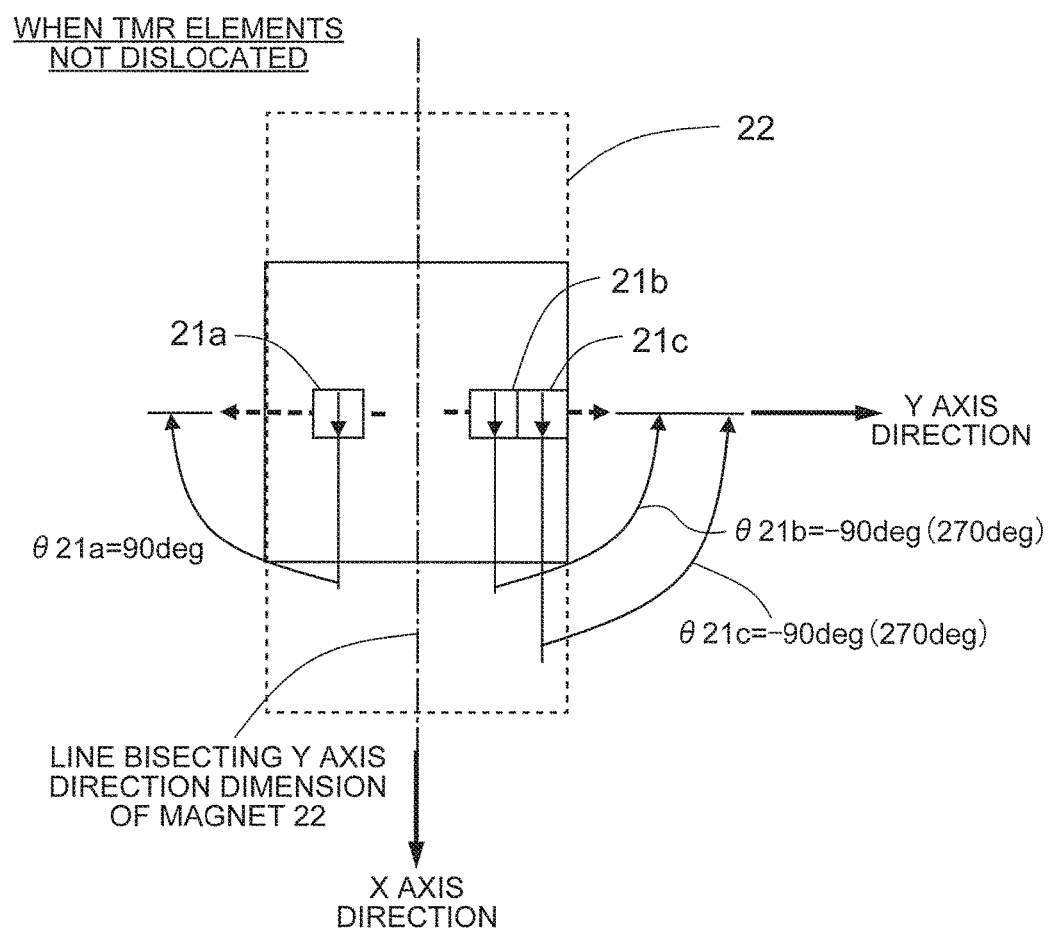
FIG. 16 is a partially enlarged view of a magnetic circuit configuration according to a third embodiment of this invention.

More specifically, in the third embodiment, the TMR elements 21a, 21b are disposed symmetrically side by side in the Y axis direction on either side of the plane constituted by the Z axis direction and the line that is parallel to the X axis direction and bisects the Y axis direction dimension of the magnet 22. FIG. 16 is a partially enlarged view of a magnetic circuit configuration according to the third embodiment of this invention, and shows a TMR element arrangement in a case where the TMR elements 21a, 21b are not dislocated in the X axis direction.

Further, as shown in FIG. 16, the TMR element 21a and the TMR element 21b are disposed substantially symmetrically relative to the plane constituted by the Z axis direction and the line that is parallel to the X axis direction and bisects the Y axis direction dimension of the magnet, while a third TMR element 21c is disposed asymmetrically relative to the TMR element 21a.

Figure 17:
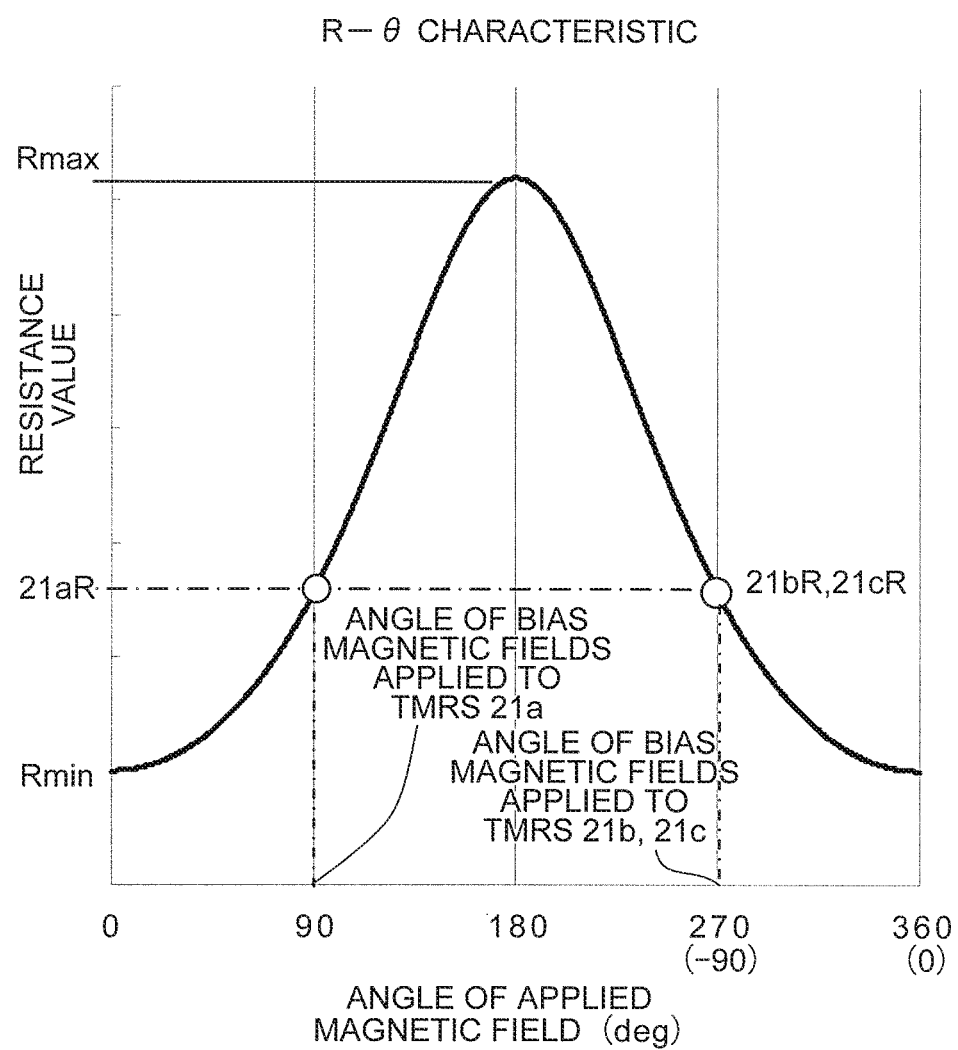
FIG. 17 is a view showing R-θ characteristics of TMR elements provided in a magnetic detection apparatus according to the third embodiment of this invention and arranged as shown in FIG. 16.

FIG. 17 is a view showing the R-θ characteristics of the TMR elements provided in the magnetic detection apparatus according to the third embodiment of this invention and disposed as shown in FIG. 16, and shows angles of bias magnetic fields applied to the three TMR elements 21a, 21b, 21c as well as resistance values thereof when the TMR elements 21a, 21b, 21c are not dislocated in the X axis direction. As shown in FIG. 16, bias magnetic fields are applied to the TMR element 21b and the TMR element 21c at respective angles of 90 deg and −90 deg relative to the magnetization directions of the pinned layers of the TMR elements, and therefore the TMR element 21b and the TMR element 21c exhibit identical resistance values.

Figure 18:
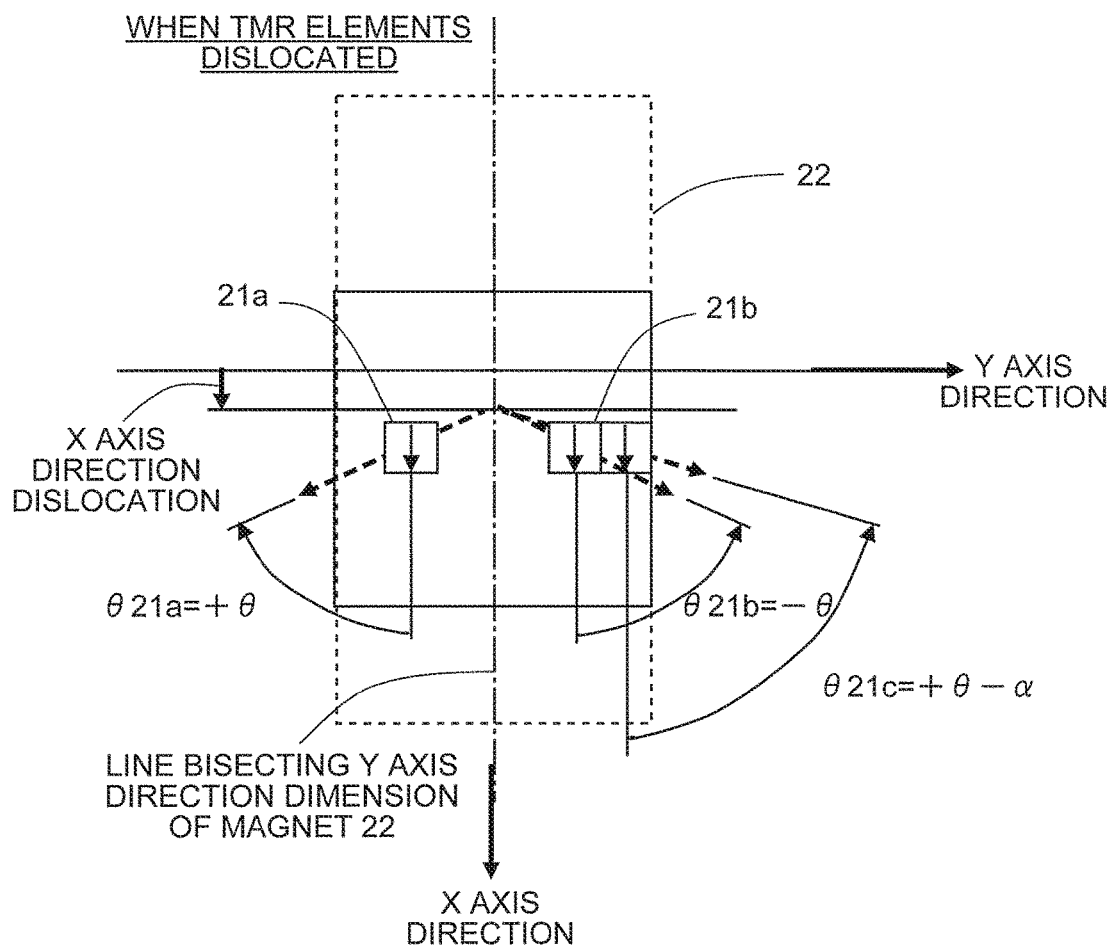
FIG. 18 is a partially enlarged view of the magnetic circuit configuration according to the third embodiment of this invention.

On the other hand, FIG. 18 is a partially enlarged view of the magnetic circuit configuration according to the third embodiment of this invention, and shows a TMR element arrangement in a case where the TMR elements 21a, 21b are dislocated in the X axis direction. In other words, the arrangement of the three TMR elements in FIG. 18 corresponds to a case in which the three TMR elements in FIG. 16 are disposed so as to be dislocated in the X axis direction.

Figure 19:
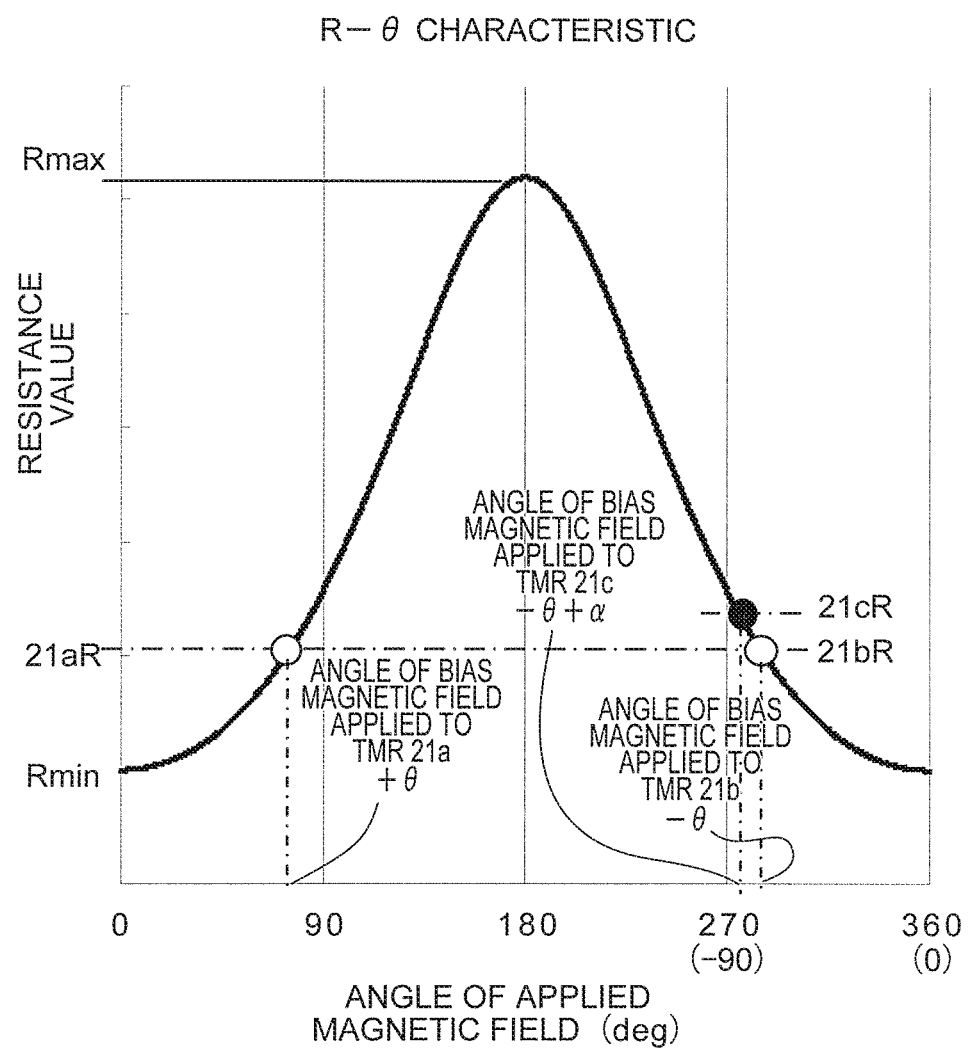
FIG. 19 is a view showing R-θ characteristics of TMR elements provided in the magnetic detection apparatus according to the third embodiment of this invention and arranged as shown in FIG. 18.

FIG. 19 is a view showing the R-θ characteristics of the TMR elements provided in the magnetic detection apparatus according to the third embodiment of this invention and arranged as shown in FIG. 18, and shows the angles of the bias magnetic fields applied to the three TMR elements 21a, 21b, 21c as well as the resistance values thereof when the TMR elements 21a, 21b, 21c are dislocated in the X axis direction. With the arrangement shown in FIG. 18, as shown in FIG. 19, bias magnetic fields are applied to the TMR element 21a and the TMR element 21b, which are disposed substantially symmetrically on the plane constituted by the Z axis direction and the line that is parallel to the X axis direction and bisects the Y axis direction dimension of the magnet, at angles of ±θ, and therefore the TMR element 21a and the TMR element 21b exhibit identical resistance values.

However, the angle of the bias magnetic field applied to the asymmetrically disposed TMR element 21c is −θ+α, and therefore the TMR element 21c exhibits a different resistance value to the TMR element 21a and the TMR element 21b. It can therefore be seen from a comparison of FIGS. 16 and 17 with FIGS. 18 and 19 that the detection precision of the final output can be improved by arranging the TMR element 21a and the TMR element 21b symmetrically side by side in the Y axis direction and without being dislocated in the X axis direction.

According to the third embodiment, as described above, two TMR elements are used as the resistors of the bridge circuit that determines the differential output voltage. Moreover, the two TMR elements are disposed symmetrically and without being dislocated in the X axis direction. As a result, an improvement can be obtained in the effects of the second embodiment.

Fourth Embodiment

In a fourth embodiment, a case in which two TMR elements are disposed such that a phase of the final output voltage shifts by a ¼ period in comparison with the first embodiment will be described. Note that a magnetic circuit configuration of the fourth embodiment is identical to that of the first embodiment apart from the TMR element arrangement.

FIG. 20 is a partially enlarged view of the magnetic circuit configuration according to the fourth embodiment of this invention. FIG. 20 shows two TMR elements 31a, 31b, a magnet 32, and an IC 35 including a circuit board or a processing circuit on which the TMR elements 31a, 31b are mounted.

In the magnetic circuit configuration according to the fourth embodiment, a bridge circuit is configured by disposing two or more TMR elements side by side in the X axis direction on either side of a plane constituted by the Z axis direction and a line (corresponding to an "X axis direction dimension bisecting line" in FIG. 20) that is parallel to the Y axis direction and bisects an X axis direction dimension of the magnet 32 in FIG. 1, i.e. the view showing the magnetic circuit configuration according to the first embodiment. FIG. 20 shows an example of a case in which the two TMR elements 31a, 31b are disposed side by side.

As shown in FIG. 20, a bias magnetic field of θ31a=180 deg−θ31b is applied to the TMR element 31a relative to the magnetization direction of the pinned layer of the TMR element.

Figure 21:
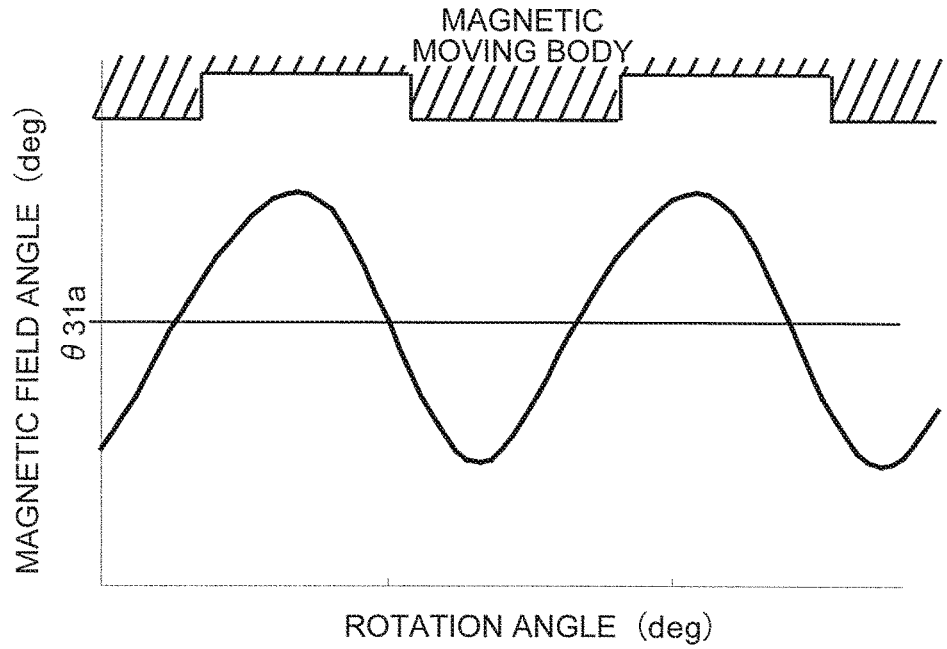
FIG. 21 is a view showing variation in an angle of a magnetic field applied to a TMR element provided in a magnetic detection apparatus according to a fourth embodiment of this invention.
Figure 22:
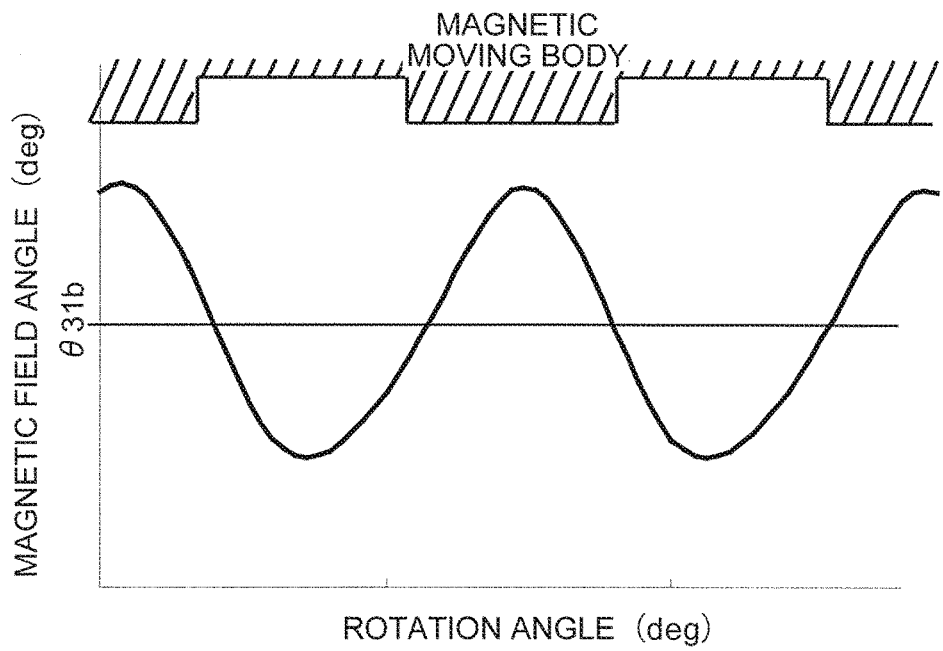
FIG. 22 is a view showing variation in an angle of a magnetic field applied to a TMR element provided in the magnetic detection apparatus according to the fourth embodiment of this invention.

FIGS. 21 and 22 are views showing variation in the angles of the magnetic fields applied respectively to the TMR elements provided in the magnetic detection apparatus according to the fourth embodiment of this invention. More specifically, FIG. 21 shows a result of a magnetic field simulation simulating variation in the angle of the magnetic field applied to the TMR element 31a corresponding to the irregularities that appear as the magnetic moving body 13 rotates, and FIG. 22 shows a result of a magnetic field simulation simulating variation in the angle of the magnetic field applied to the TMR element 31b corresponding to the irregularities that appear as the magnetic moving body 13 rotates.

Figure 23:
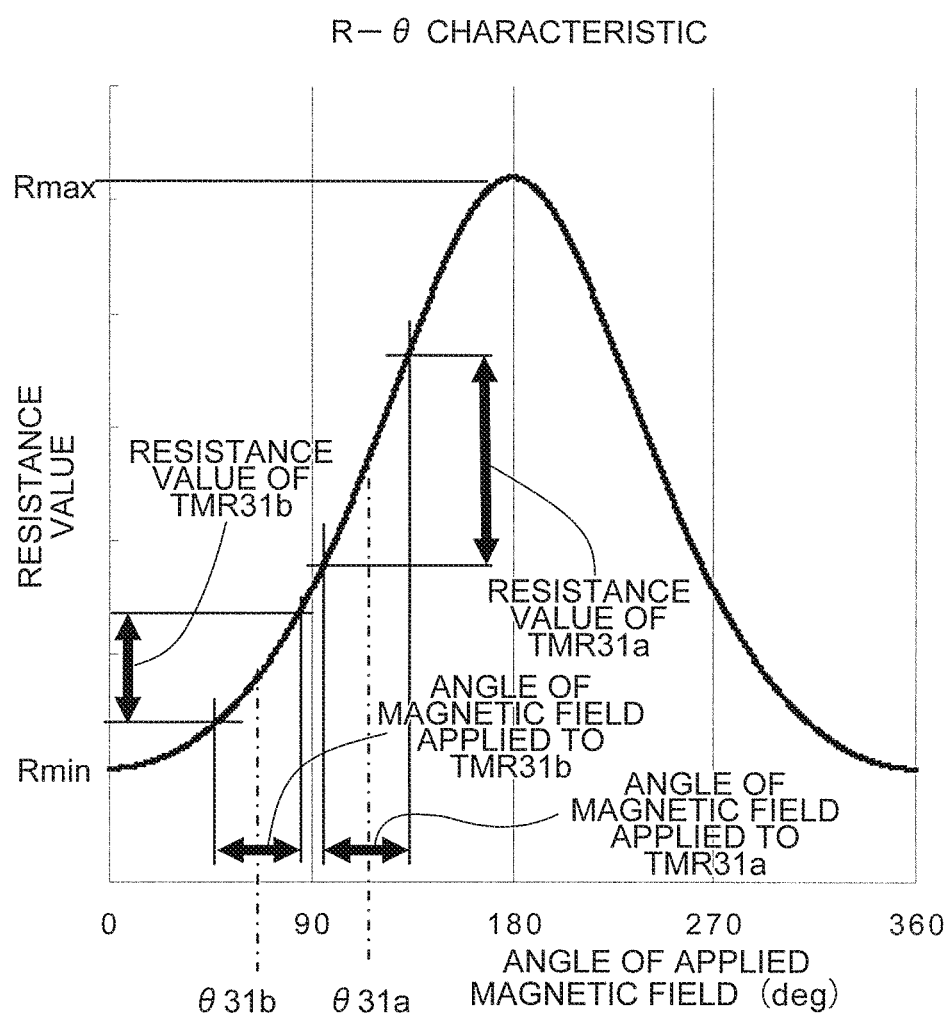
FIG. 23 is a view showing R-θ characteristics of the TMR elements provided in the magnetic detection apparatus according to the fourth embodiment of this invention.
Figure 24:
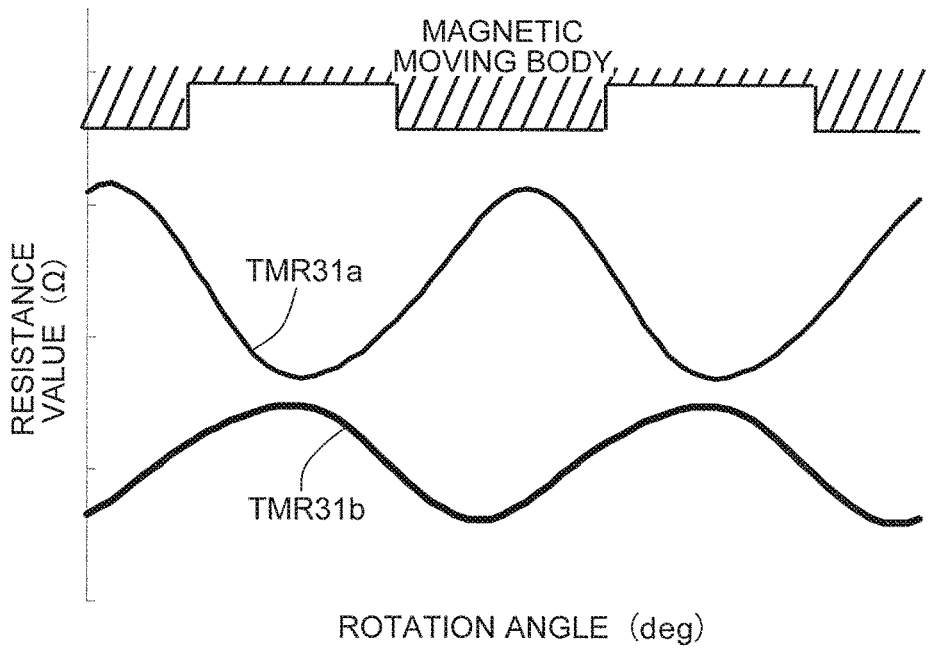
FIG. 24 is a view showing resistance change in the TMR elements provided in the magnetic detection apparatus according to the fourth embodiment of this invention.

Further, FIG. 23 is a view showing the R-θ characteristics of the TMR elements provided in the magnetic detection apparatus according to the fourth embodiment of this invention, and shows resistance change generated in response to variation in the angles of the applied magnetic fields, as shown in FIGS. 21 and 22. Furthermore, FIG. 24 is a view showing resistance change in the TMR elements provided in the magnetic detection apparatus according to the fourth embodiment of this invention. More specifically, FIG. 24 shows resistance change in the TMR elements 31a, 31b corresponding to the irregularities on the magnetic moving body 13, which is obtained by varying the angles of the applied magnetic fields as shown in FIGS. 21 and 22.

Figure 25:
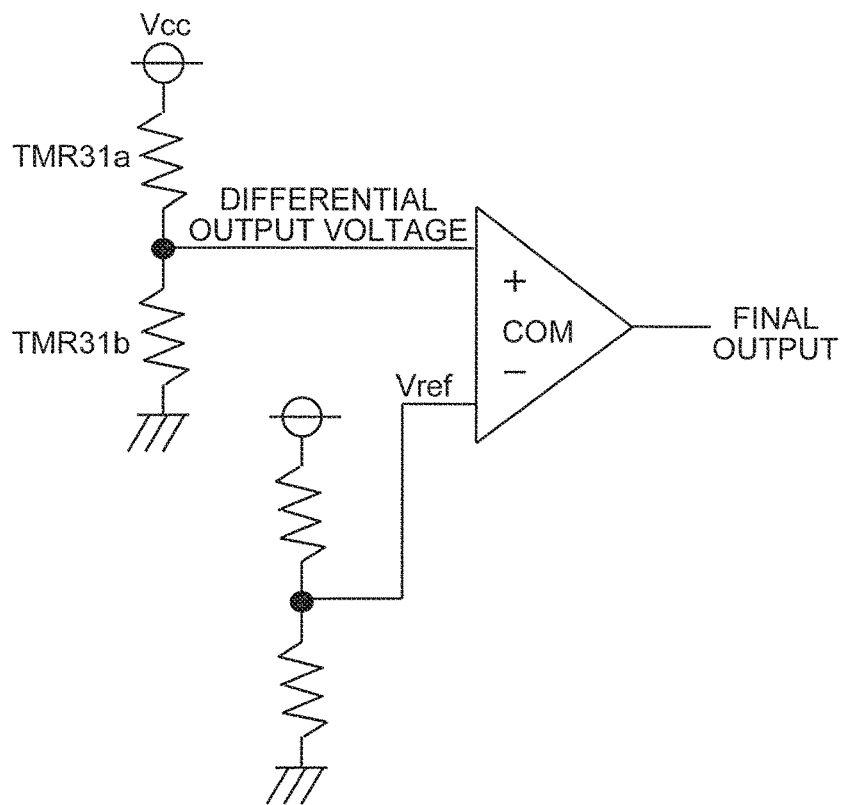
FIG. 25 is a view showing a circuit used by the magnetic detection apparatus according to the fourth embodiment of this invention to process the resistance change in the TMR elements.

FIG. 25 is a view showing a circuit used by the magnetic detection apparatus according to the fourth embodiment of this invention to process the resistance change in the TMR elements. Further, FIG. 26 is a view showing an operation waveform generated by the magnetic detection apparatus according to the fourth embodiment of this invention.

Figure 26:
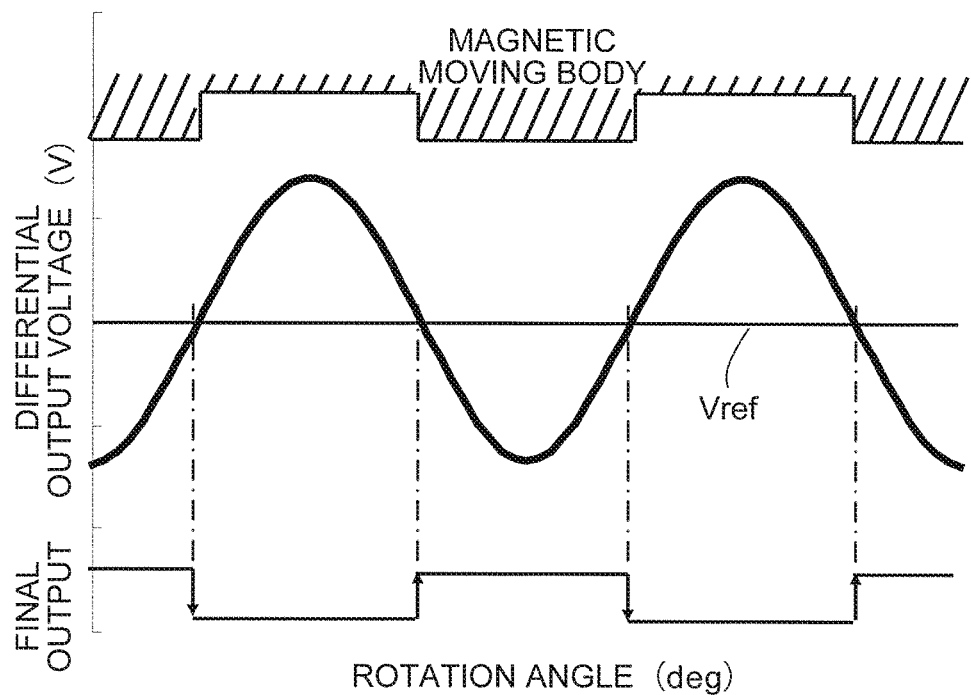
FIG. 26 is a view showing an operation waveform generated by the magnetic detection apparatus according to the fourth embodiment of this invention.

By processing the resistance change shown in FIG. 24 using the processing circuit shown in FIG. 25, a differential output voltage that corresponds to the irregularities on the magnetic moving body is obtained, as shown in FIG. 26. By comparing this differential output voltage with the reference voltage Vref, a final output signal having a phase that differs by a ¼ period relative to the final output signal according to the first embodiment, shown in FIG. 7, and that reverses at the recessed portion center and the projecting portion center of the magnetic moving body, is obtained.

According to the fourth embodiment, as described above, two TMR elements arranged as shown in FIG. 20 are used. With this arrangement, similar effects to the first embodiment can be obtained in a condition where the phase of the final output signal is shifted by a ¼ period relative to that of the first embodiment.

Fifth Embodiment

In the fifth embodiment, a case in which a configuration for reducing the temperature offset of the differential output voltage so that the detection precision is stabilized irrespective of the temperature of the IC is added to the configuration of the fourth embodiment will be described.

Figure 27:
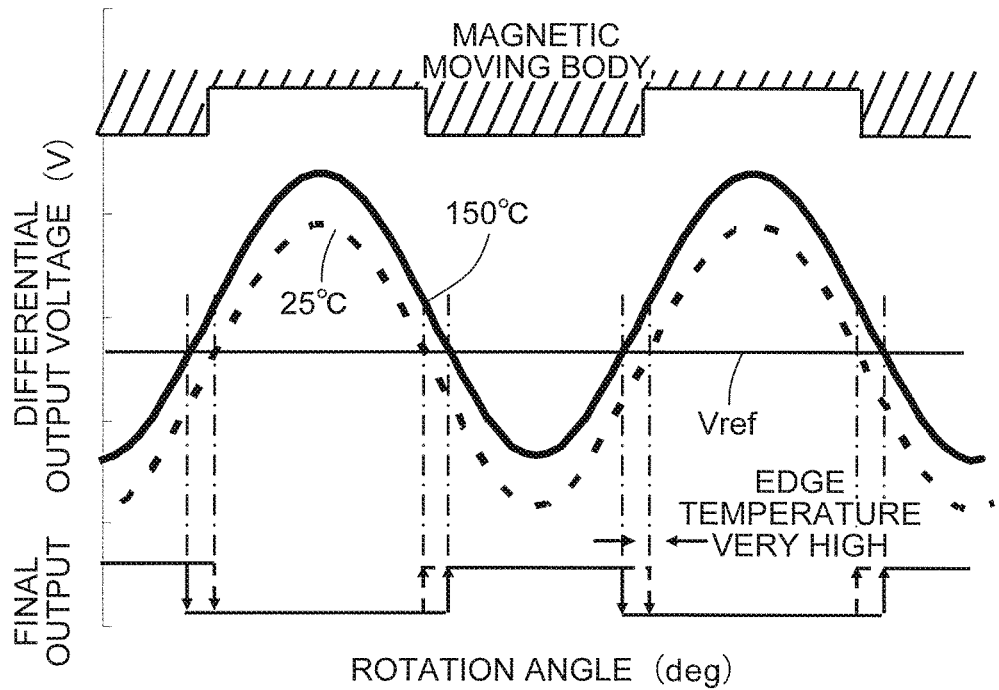
FIG. 27 is a view showing a temperature dependence of the operation waveform generated by the magnetic detection apparatus according to the fourth embodiment of this invention.

FIG. 27 is a view showing the temperature dependence of the operation waveform generated by the magnetic detection apparatus according to the fourth embodiment of this invention. More specifically, a dotted line shows the waveform of the differential output voltage shown in FIG. 26 when the temperature of the detection circuit is 25° C., and a solid line shows the waveform when the temperature of the detection circuit is 150° C.

In the fourth embodiment, as shown in FIGS. 23 and 24, the resistance values of the TMR element 31a and the TMR element 31b constituting the bridge deviate from each other, and therefore the temperature coefficients of the resistance values do not match. As shown in FIG. 27, therefore, a temperature offset occurs in the differential output voltage, with the result that the final output likewise shifts according to the temperature. Hence, in the fifth embodiment, a specific configuration for solving the problem of this temperature offset will be described.

FIG. 28 is a partially enlarged view of a magnetic circuit configuration according to the fifth embodiment of this invention. FIG. 28 shows four TMR elements 31a, 31b, 31c, 31d, the magnet 32, and the IC 35 including a circuit board or a processing circuit on which the TMR elements 31a to 31d are mounted.

In the magnetic circuit configuration according to the fifth embodiment, the two TMR elements 31c, 31d are further added to the configuration according to the fourth embodiment, shown in FIG. 20. Identical components have been allocated identical reference symbols, and description thereof has been omitted.

In FIG. 28, the four TMR elements 31a, 31b, 31c, 31d form two pairs that are constituted respectively by the TMR elements 31a, 31b and the TMR elements 31c, 31d and arranged side by side in the X axis direction so as to be substantially symmetrical on a plane constituted by the Z axis direction and the line that is parallel to the Y axis direction and bisects the X axis direction dimension of the magnet. As shown in FIG. 28, bias magnetic fields of θ31a=180−θ31b, θ31c=−θ31a, and θ31d=−θ31b are applied to the respective TMR elements relative to the magnetization direction of the pinned layer of the TMR element.

Figure 29:
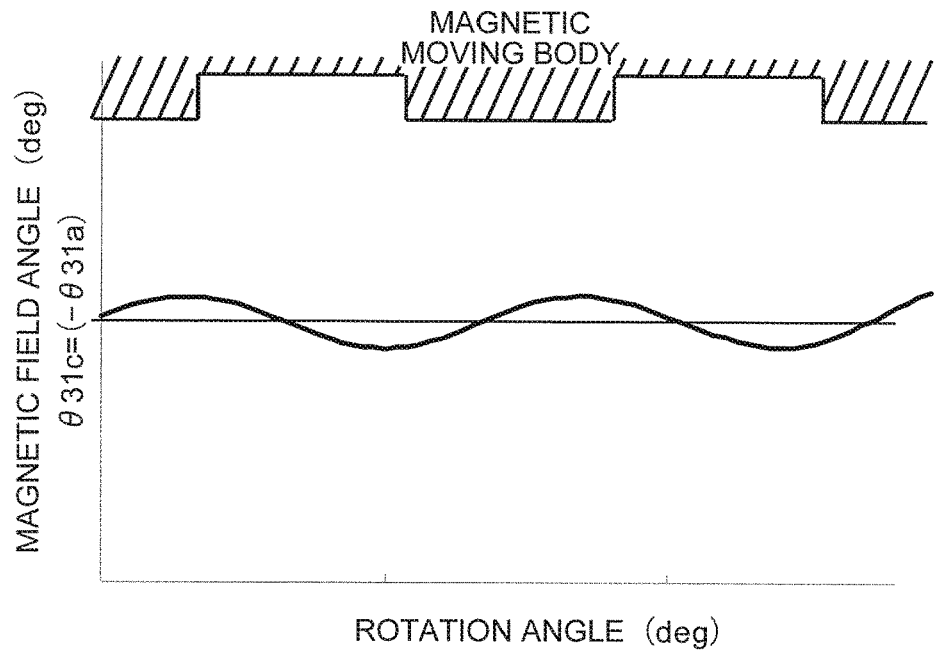
FIG. 29 is a view showing variation in an angle of a magnetic field applied to a TMR element newly added to a magnetic detection apparatus according to the fifth embodiment of this invention.
Figure 30:
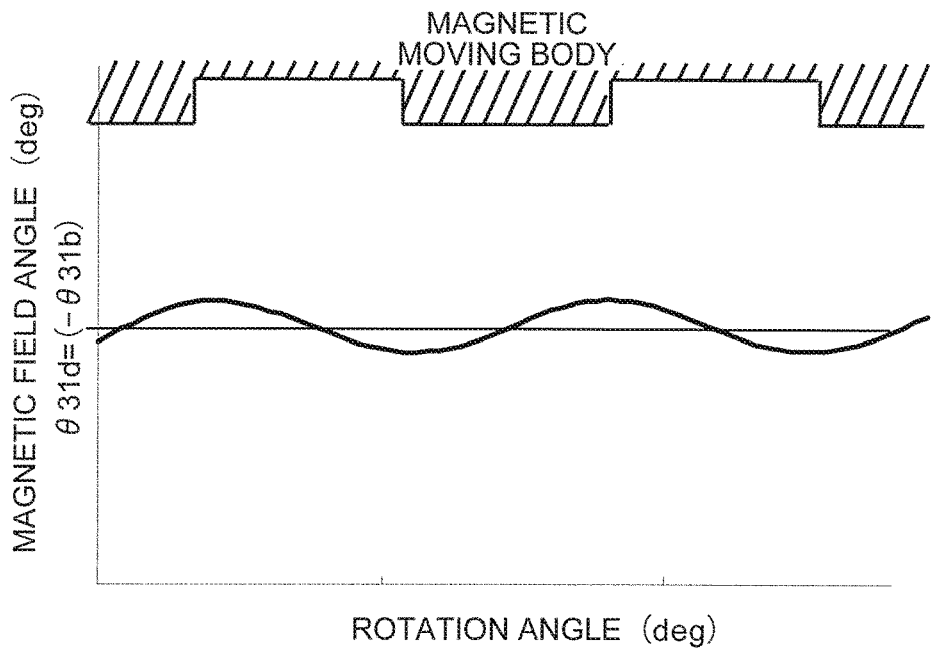
FIG. 30 is a view showing variation in an angle of a magnetic field applied to a TMR element newly added to the magnetic detection apparatus according to the fifth embodiment of this invention.

FIGS. 29 and 30 are views showing variation in the angles of the magnetic fields applied respectively to the TMR elements newly added to the magnetic detection apparatus according to the fifth embodiment of this invention. More specifically, FIG. 29 shows a result of a magnetic field simulation simulating variation in the angle of the magnetic field applied to the TMR element 31c corresponding to the irregularities that appear as the magnetic moving body 13 rotates, and FIG. 30 shows a result of a magnetic field simulation simulating variation in the angle of the magnetic field applied to the TMR element 31d corresponding to the irregularities that appear as the magnetic moving body 13 rotates. Note that the variation in the angle of the magnetic field applied to the TMR element 31a and the variation in the angle of the magnetic field applied to the TMR element 31b are respectively identical to those of FIG. 21 and FIG. 22, described above.

Figure 31:
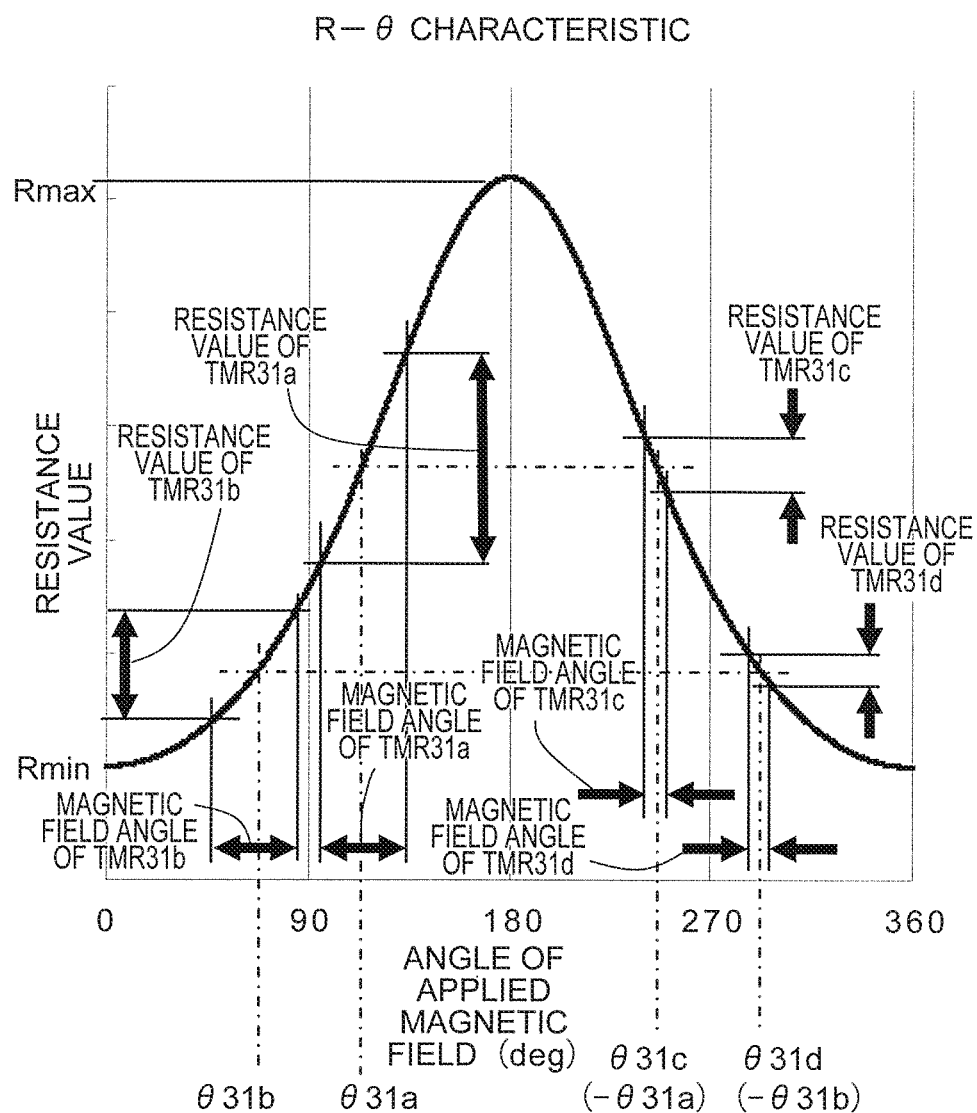
FIG. 31 is a view showing R-θ characteristics of the TMR elements provided in the magnetic detection apparatus according to the fifth embodiment of this invention.
Figure 32:
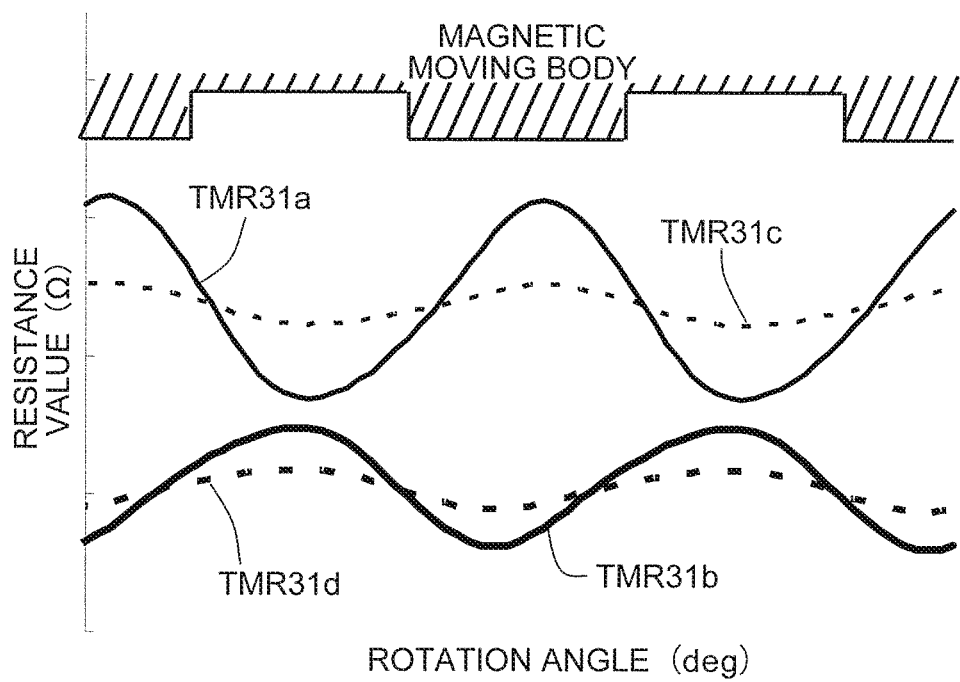
FIG. 32 is a view showing resistance change in the TMR elements provided in the magnetic detection apparatus according to the fifth embodiment of this invention.

Further, FIG. 31 is a view showing the R-θ characteristics of the TMR elements provided in the magnetic detection apparatus according to the fifth embodiment of this invention, and shows resistance change generated in response to variation in the angles of the applied magnetic fields, as shown in FIGS. 21, 22, 29, and 30. Furthermore, FIG. 32 is a view showing resistance change in the TMR elements provided in the magnetic detection apparatus according to the fifth embodiment of this invention. More specifically, FIG. 32 shows resistance change in the TMR elements 31a, 31b, 31c, 31d corresponding to the irregularities on the magnetic moving body 13, which is obtained by varying the angles of the applied magnetic fields as shown in FIGS. 21, 22, 29, and 30.

As shown in FIG. 32, resistance change is obtained, in accordance with the irregularities on the magnetic moving body such that the TMR element 31a and the TMR element 31c operate at substantially identical resistance change centers and the TMR element 31d and the TMR element 31b operate at substantially identical resistance change centers.

Figure 33:
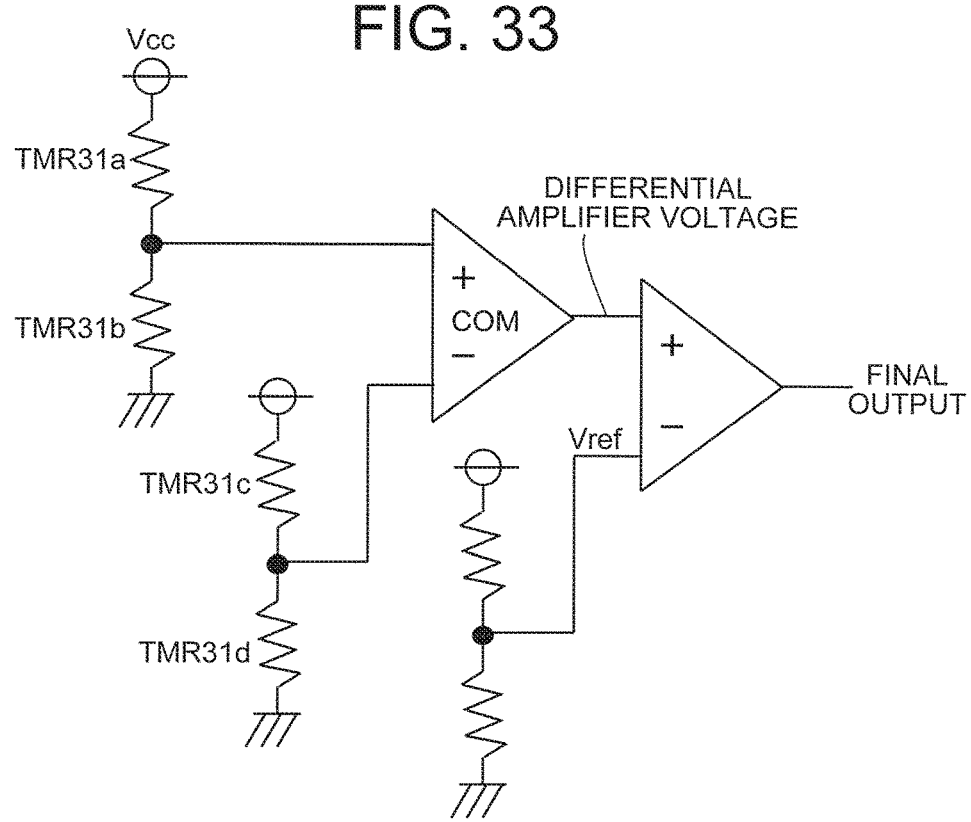
FIG. 33 is a view showing a circuit used by the magnetic detection apparatus according to the fifth embodiment of this invention to process the resistance change in the TMR elements.
Figure 34:
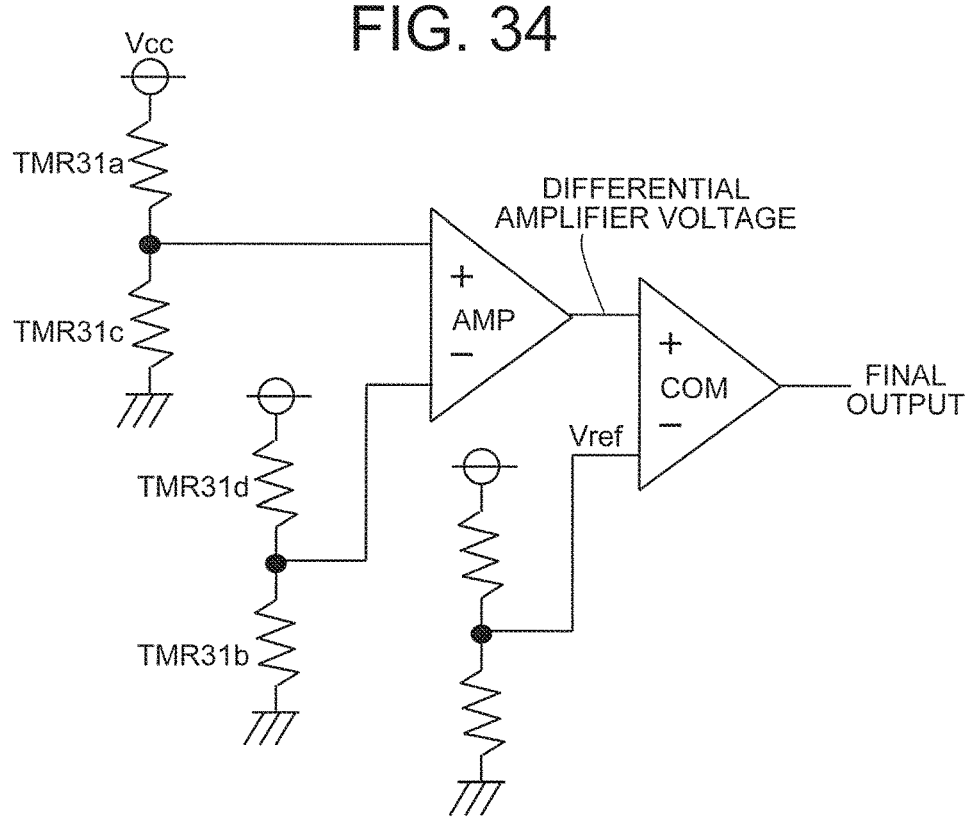
FIG. 34 is a view showing another circuit used by the magnetic detection apparatus according to the fifth embodiment of this invention to process the resistance change in the TMR elements.
Figure 35:
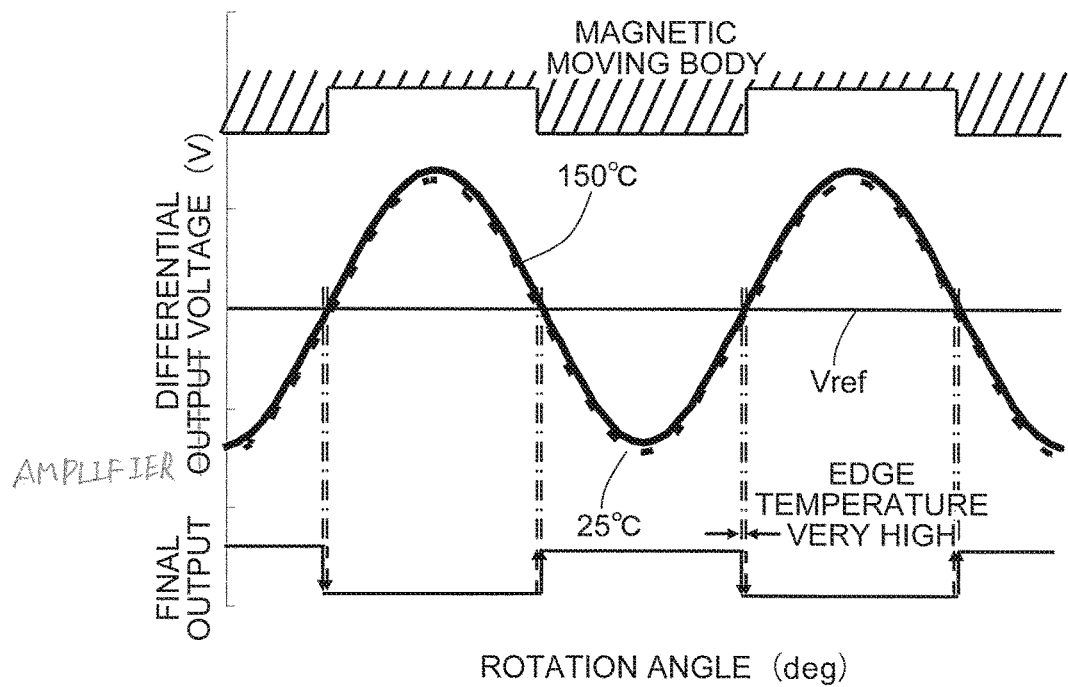
FIG. 35 is a view showing a temperature dependence of an operation waveform generated by the magnetic detection apparatus according to the fifth embodiment of this invention.

FIG. 33 is a view showing a circuit used by the magnetic detection apparatus according to the fifth embodiment of this invention to process the resistance change in the TMR elements. Further, FIG. 34 is a view showing another circuit used by the magnetic detection apparatus according to the fifth embodiment of this invention to process the resistance change in the TMR elements. Furthermore, FIG. 35 is a view showing a temperature dependence of an operation waveform generated by the magnetic detection apparatus according to the fifth embodiment of this invention. More specifically, a dotted line shows a waveform of a differential amplifier voltage obtained by the processing circuit shown in FIG. 33 or FIG. 34 when the temperature of the detection circuit is 25° C., and a solid line shows the waveform when the temperature of the detection circuit is 150° C.

In the fifth embodiment, a differential amplifier voltage is generated by constructing a bridge such as that shown in FIG. 33 or FIG. 34. Therefore, as shown in FIG. 35, the temperature offset of the differential amplifier voltage decreases such that variation in the final output due to temperature is reduced, and as a result, the final output is stabilized irrespective of the temperature.

According to the fifth embodiment, as described above, two pairs of TMR elements are used as the resistors of the bridge circuit that determines the differential amplifier voltage. Hence, in addition to the effects of the fourth embodiment, a magnetic detection apparatus in which the temperature offset of the differential amplifier voltage is reduced so that the detection precision is stabilized irrespective of the temperature of the IC can be realized.

Sixth Embodiment

In a sixth embodiment, a case in which a reversal of the magnetic moving body can be detected by combining two of the above embodiments will be described. More specifically, the TMR elements of the second embodiment or the third embodiment and the TMR elements of the fourth embodiment or the fifth embodiment are formed on an identical substrate. With this configuration, a first final output signal can be obtained from the former TMR elements and a second final output signal having a phase that differs by a ¼ period from the first final output signal can be obtained from the latter TMR elements. By obtaining these two final output signals simultaneously, a reversal of the magnetic moving body can be detected from a phase relationship between the signals.

Figure 36:
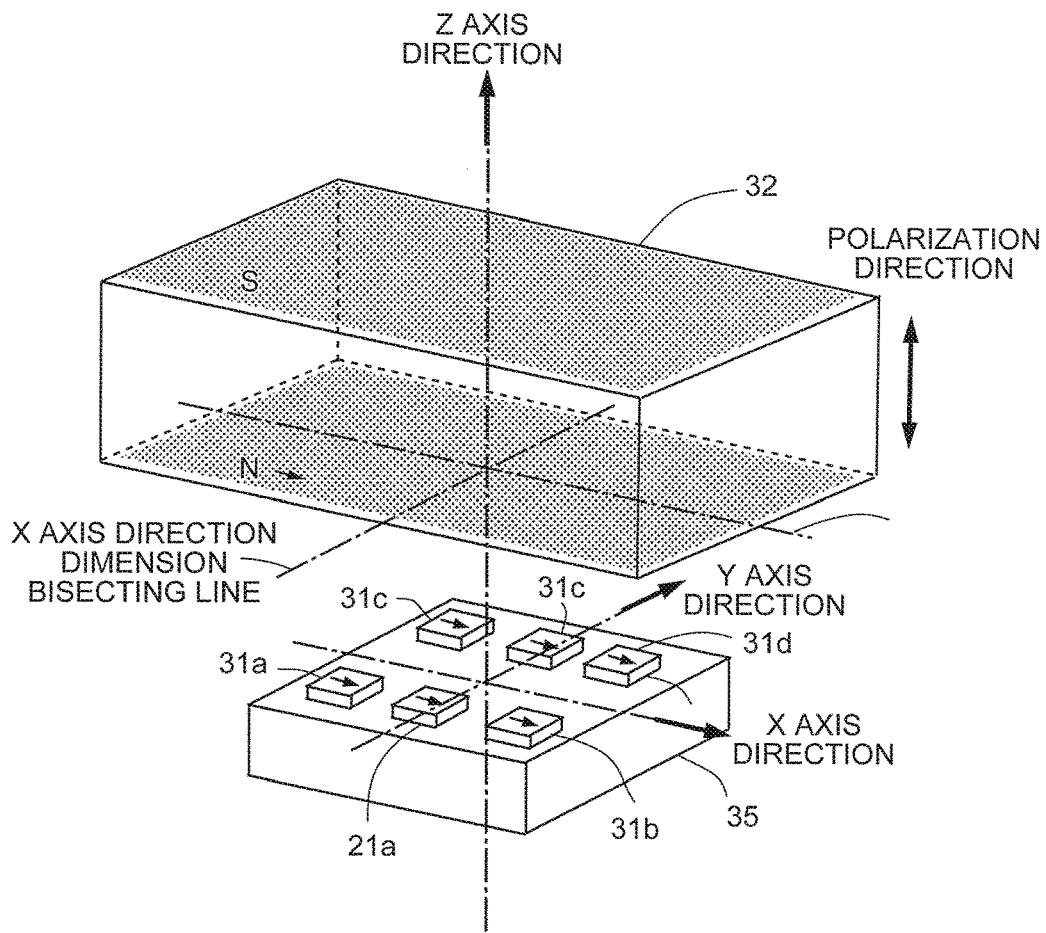
FIG. 36 is a partially enlarged view of a magnetic circuit configuration according to a sixth embodiment of this invention.
Figure 37:
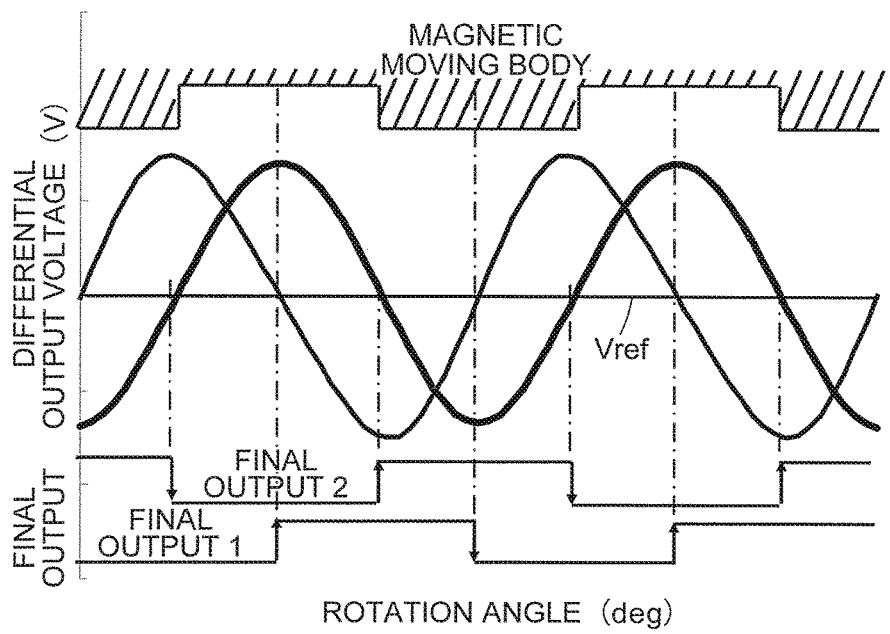
FIG. 37 is a view combining the operation waveforms generated respectively by the magnetic detection apparatuses according to the third embodiment and the fifth embodiment of this invention.

FIG. 36 is a partially enlarged view of a magnetic circuit configuration according to a sixth embodiment of this invention, and corresponds to a combination of the configuration described in the third embodiment and the configuration described in the fifth embodiment. Reference symbols in FIG. 36 correspond to the reference symbols described in the third and fifth embodiments, and therefore description thereof has been omitted. Further, FIG. 37 is a view combining the operation waveforms generated respectively by the magnetic detection apparatuses according to the third embodiment and the fifth embodiment of this invention.

Figure 38:
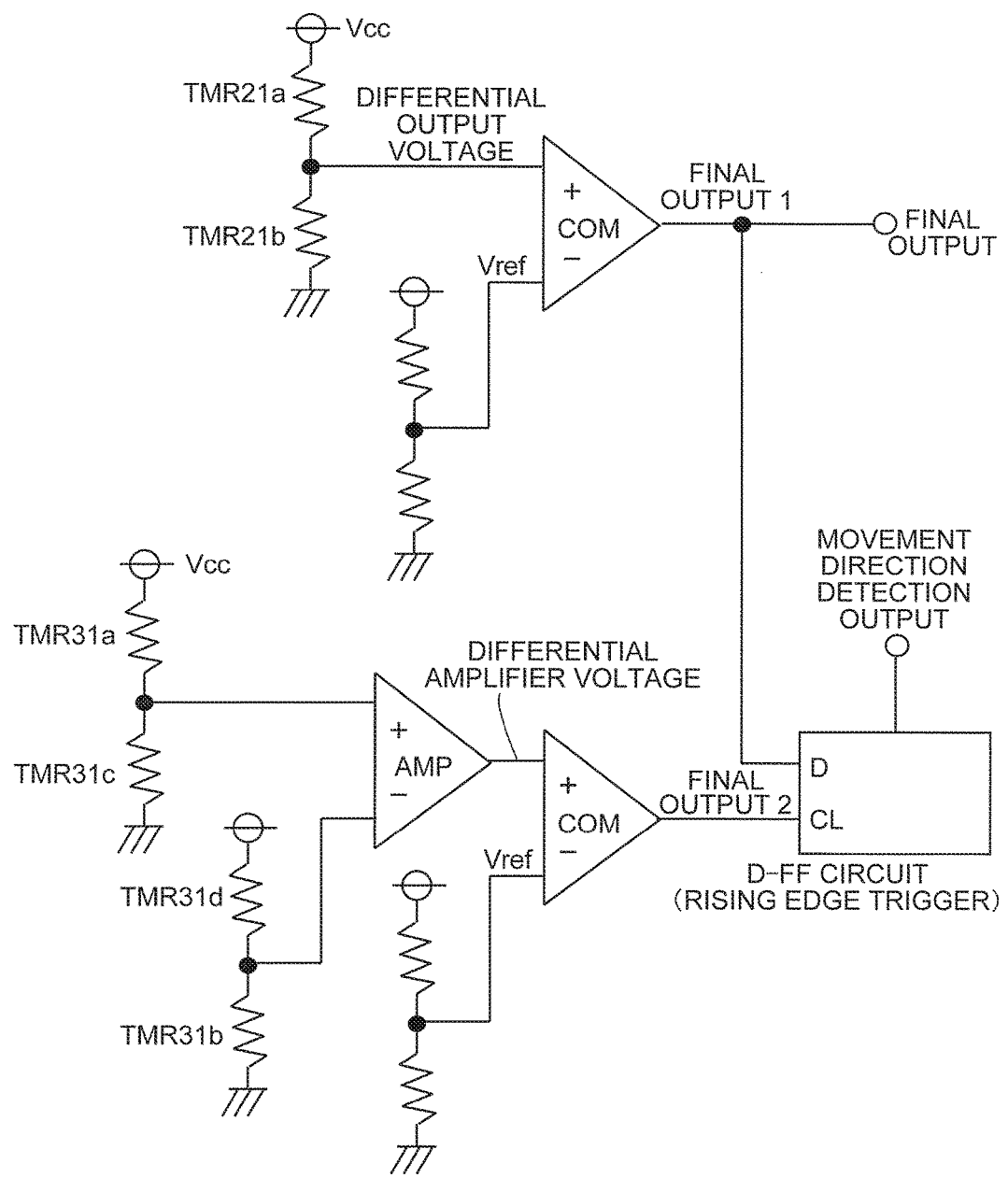
FIG. 38 is a view showing a circuit used by a magnetic detection apparatus according to the sixth embodiment of this invention to process resistance change in the TMR elements.

FIG. 38 is a view showing a circuit used by a magnetic detection apparatus according to the sixth embodiment of this invention to process resistance change in the TMR elements. In the sixth embodiment, a reversal of the magnetic moving body can be detected by processing a final output 1 obtained from the third embodiment and a final output 2 obtained from the fifth embodiment using the processing circuit shown in FIG. 38.

Figure 39:
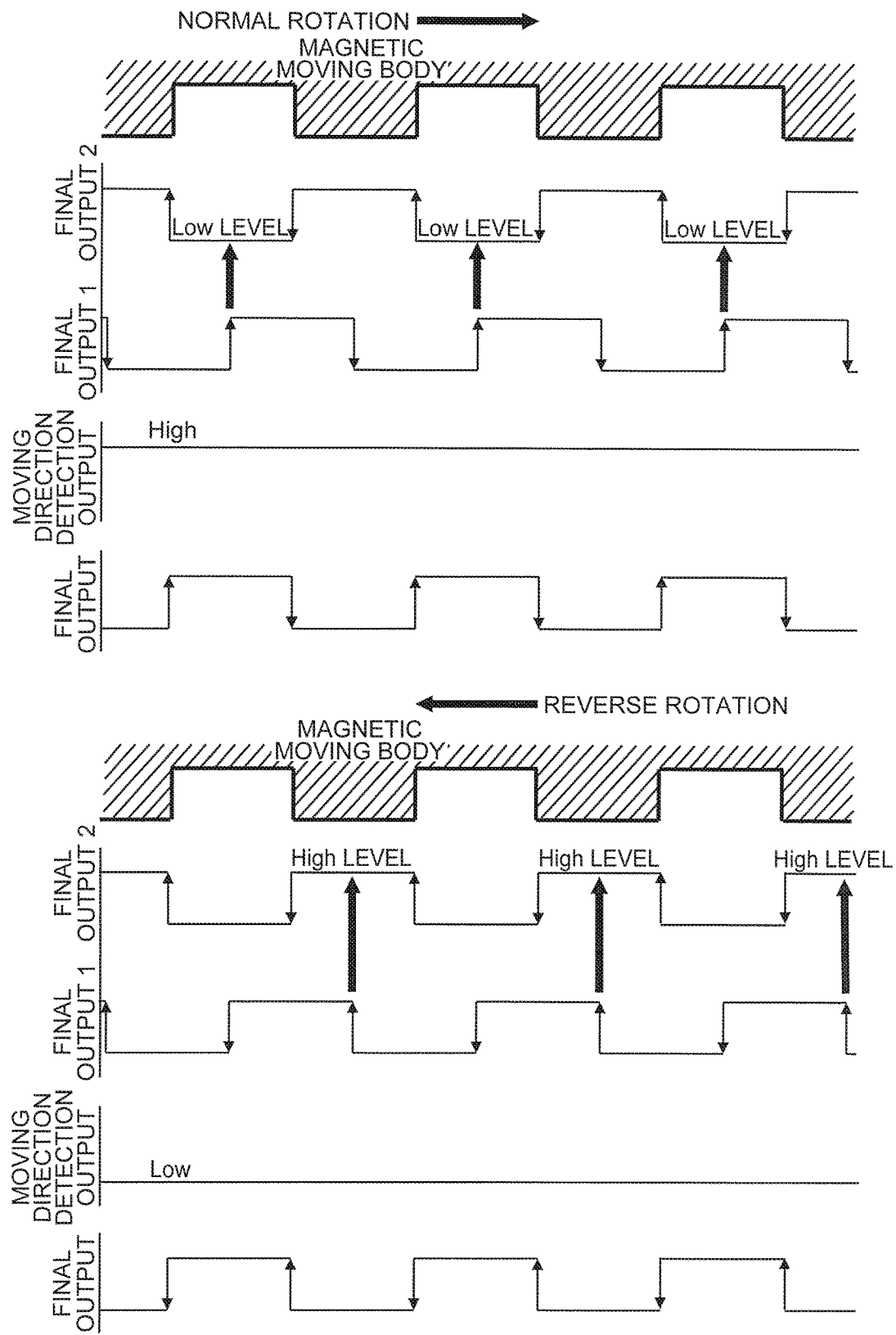
FIG. 39 is a view showing a timing chart of a final output, a final output 1, and a final output 2 obtained by the magnetic detection apparatus according to the sixth embodiment of this invention during normal rotation and reverse rotation.

FIG. 39 is a view showing a timing chart of the final output, the final output 1, and the final output 2 obtained by the magnetic detection apparatus according to the sixth embodiment of this invention during normal rotation and reverse rotation. During normal rotation, as shown in FIG. 39, the final output 2 is at a Low level and a movement direction detection output is at a High level at a rise timing of the final output 1.

During reverse rotation, on the other hand, the final output 2 is at a High level and the movement direction detection output is at a Low revel at the rise timing of the final output 1. The magnetic detection apparatus according to the first embodiment is thus capable of detecting a rotation direction of the magnetic moving body at the same time as the normal, highly precise final output signal corresponding to the irregularities in the magnetic moving body.

According to the sixth embodiment, as described above, the rotation direction of the magnetic moving body can be detected simultaneously using two circuits, from which final outputs having phases that differ from each other by a ¼ period are obtained, in combination.

Seventh Embodiment

In a seventh embodiment, a case in which optimum bias magnetic fields are applied to the TMR elements by disposing a magnetic body guide having a pair of projecting portions on a TMR element side thereof between the TMR elements and the magnet in the Z axis direction in the magnetic circuit configurations according to the first to sixth embodiments, described above.

Figure 40:
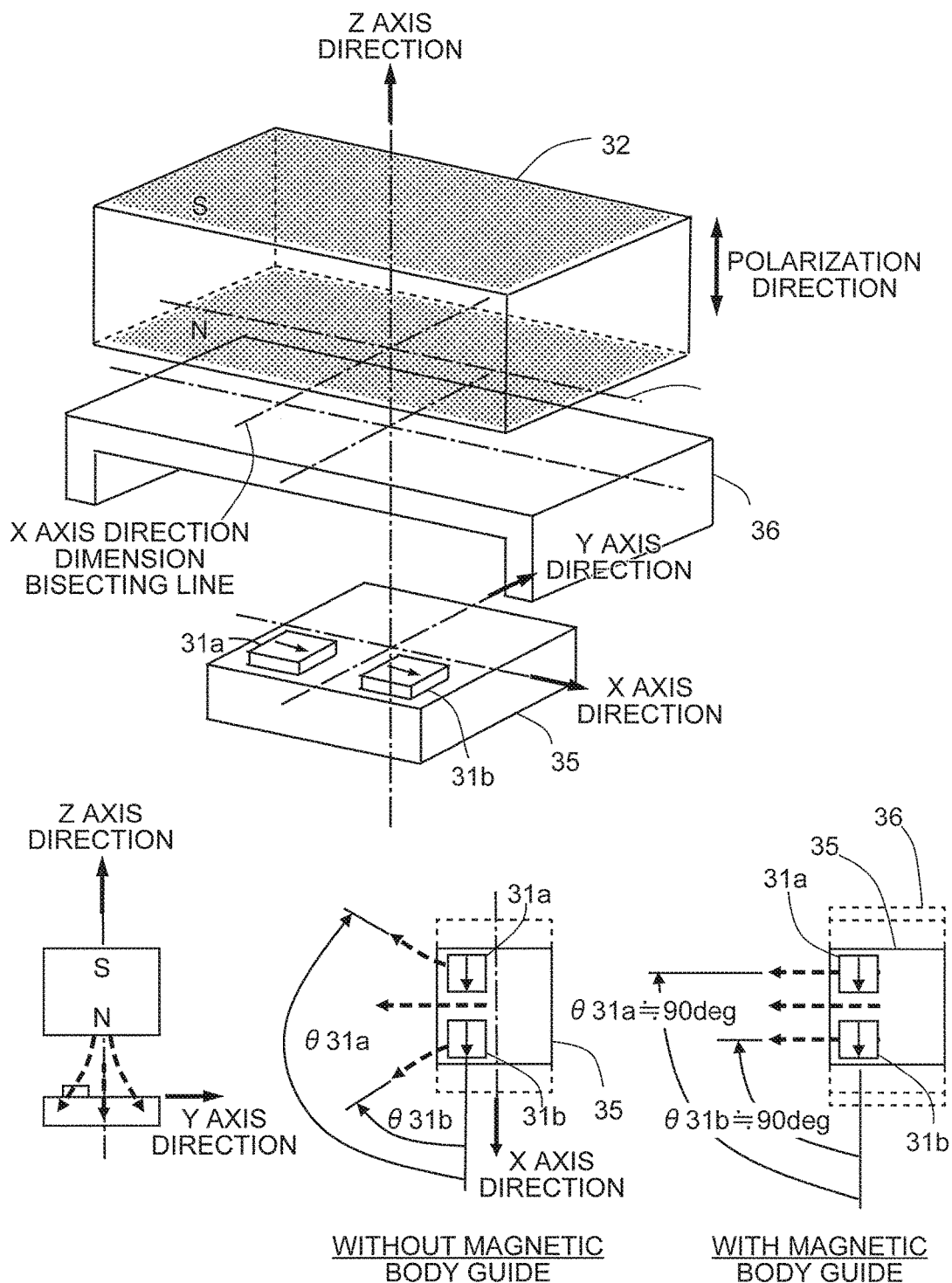
FIG. 40 is a partially enlarged view of a magnetic circuit configuration according to a seventh embodiment of this invention.

FIG. 40 is a partially enlarged view of a magnetic circuit configuration according to the seventh embodiment of this invention. FIG. 40 shows the TMR elements 31a, 31b, the magnet 32, the IC 35 including a circuit board or a processing circuit on which the TMR elements 31a, 31b are mounted, and a magnetic body guide 36 serving as a new configuration. The magnetic body guide 36 is used to apply optimum bias magnetic fields to the TMR elements 31a, 31b. Apart from the magnetic body guide 36, the seventh embodiment is identical to the fourth embodiment. Hence, identical symbols have been allocated to identical components, and description thereof has been omitted.

When the magnetic body guide 36 is not provided (i.e. in the case of the fourth embodiment described above), bias magnetic fields are applied to the TMR element 31a and the TMR element 31b at different angles relative to the magnetization directions of the pinned layers of the TMR elements. When the magnetic body guide 36 is provided, on the other hand, bias magnetic fields are applied to both the TMR element 31a and the TMR element 31b at substantially 90 deg relative to the magnetization directions of the pinned layers of the TMR elements.

Figure 41:
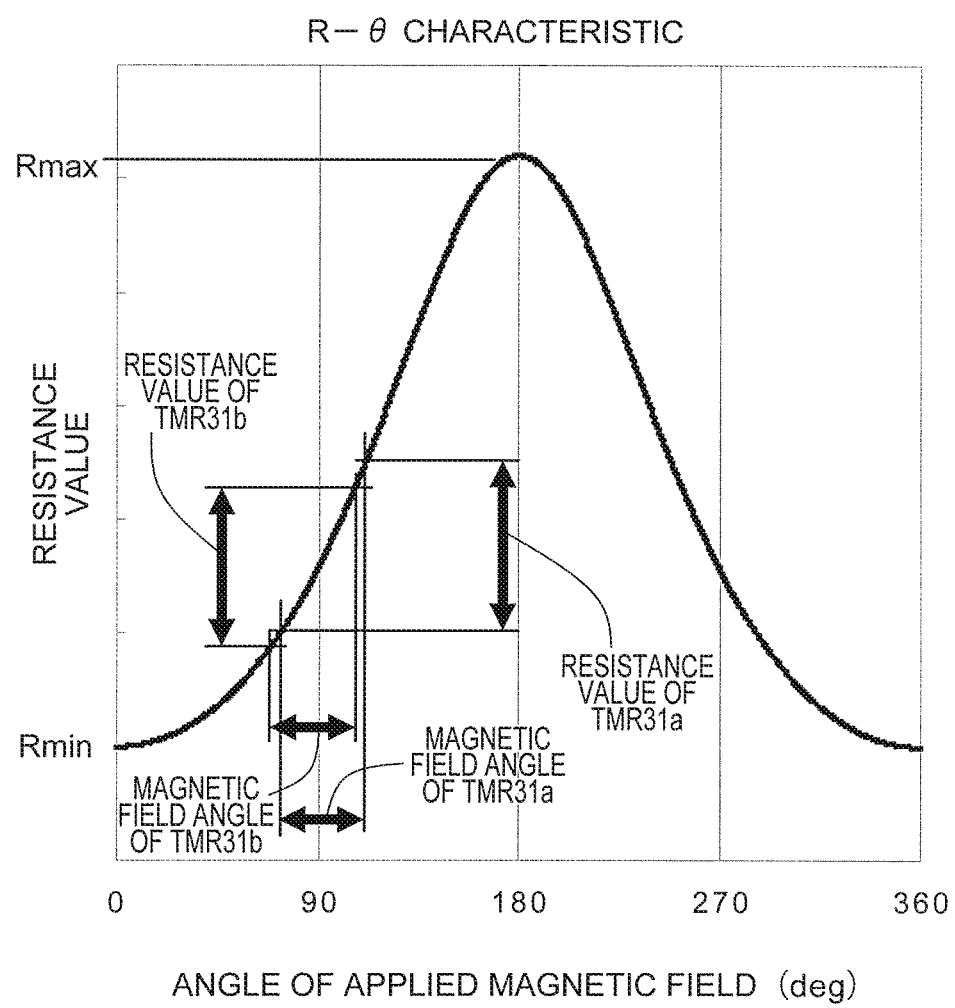
FIG. 41 is a view showing R-θ characteristics of TMR elements provided in a magnetic detection apparatus according to the seventh embodiment of this invention.
Figure 42:
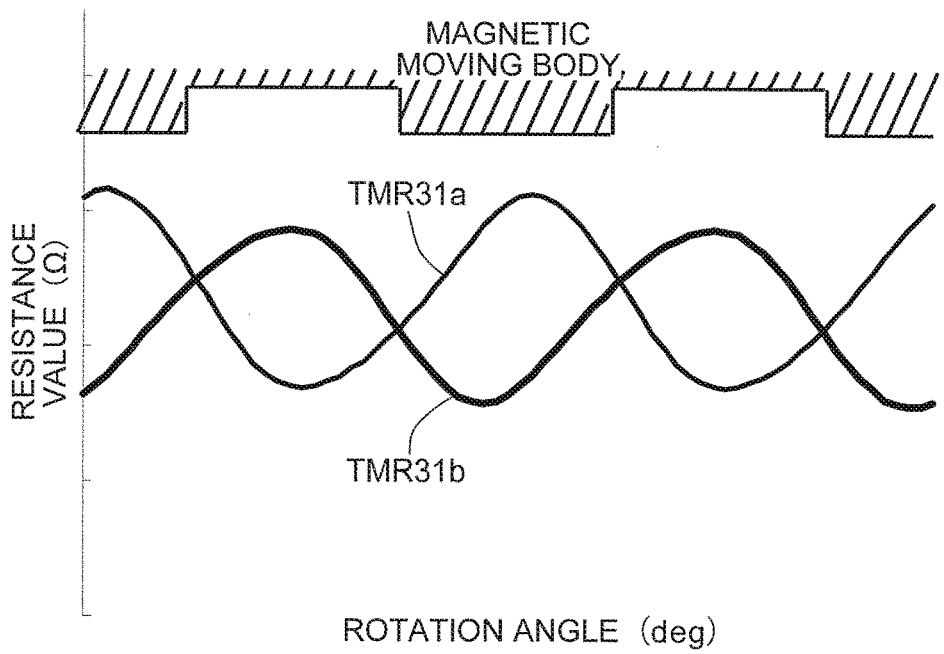
FIG. 42 is a view showing resistance change in the TMR elements provided in the magnetic detection apparatus according to the seventh embodiment of this invention.
Figure 43:
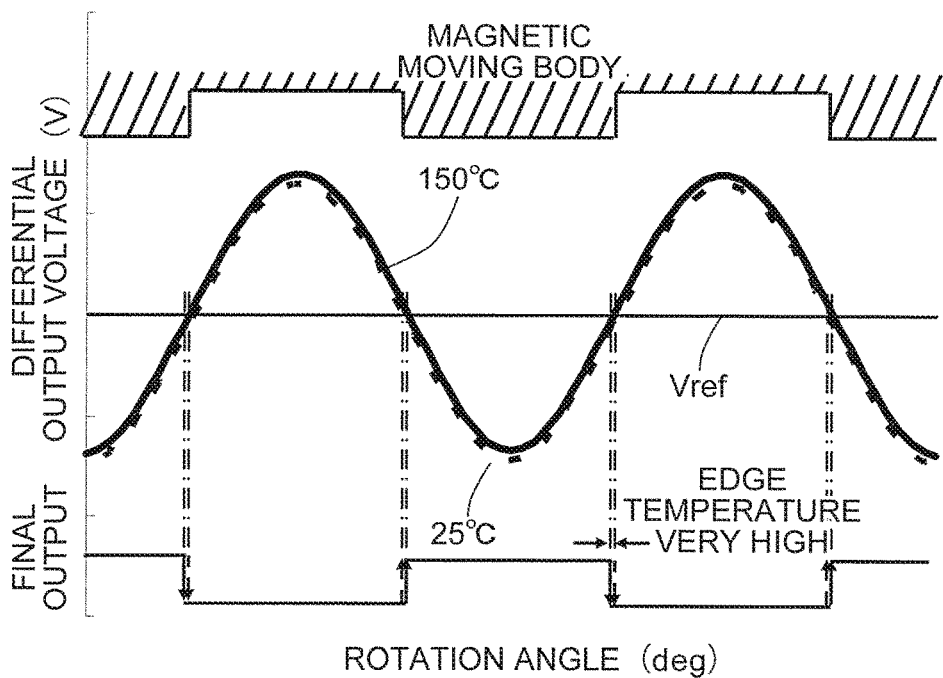
FIG. 43 is a view showing a temperature dependence of an operation waveform generated by the magnetic detection apparatus according to the seventh embodiment of this invention.
Figure 44:
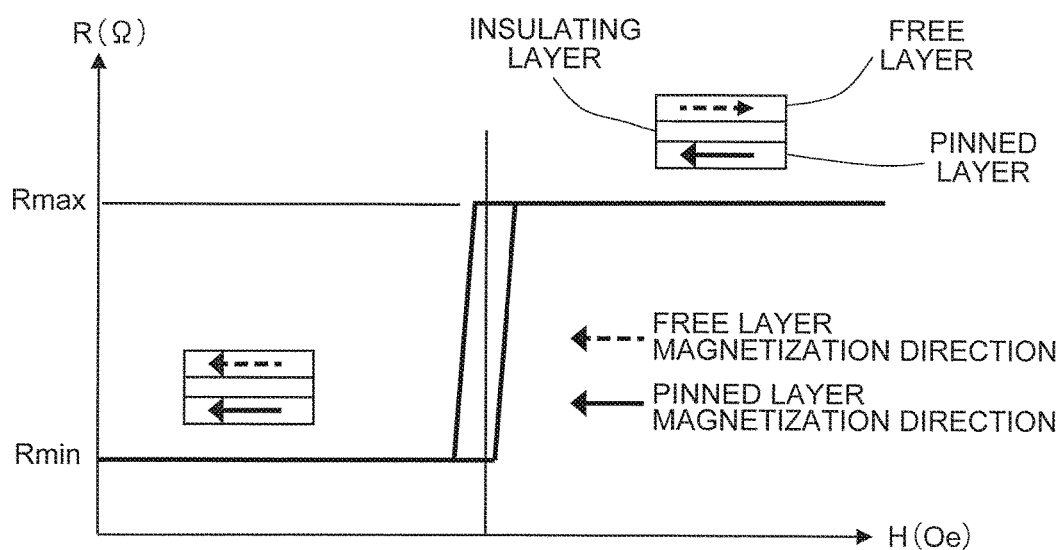
FIG. 44 is a view showing an R-H characteristic of a TMR element.
Figure 46:
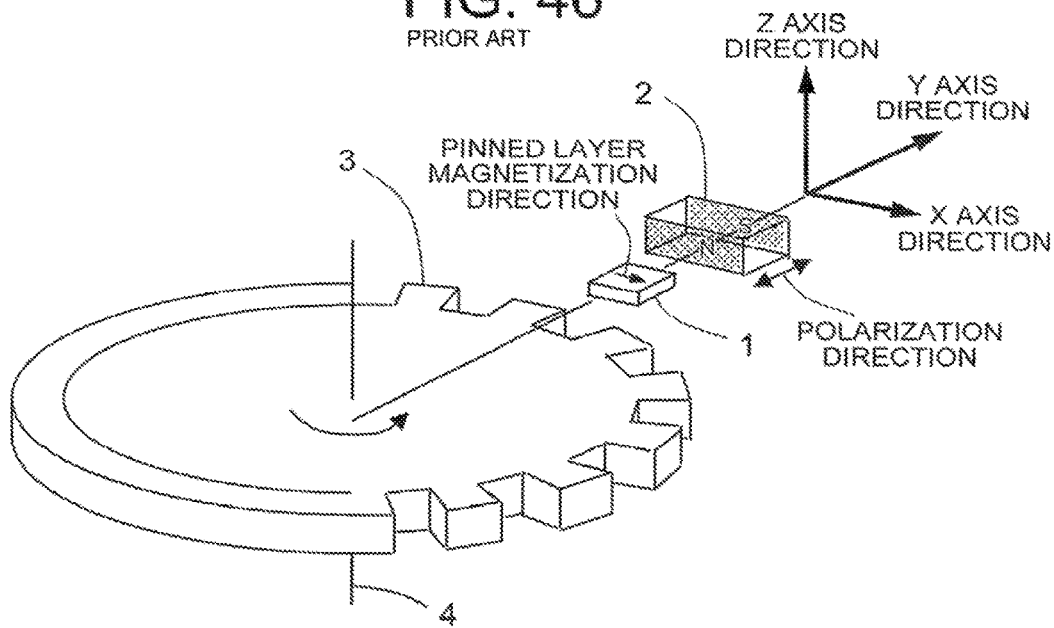
FIG. 46 is a view showing a magnetic circuit configuration of a conventional magnetic detection apparatus employing the TMR element.
Figure 47:
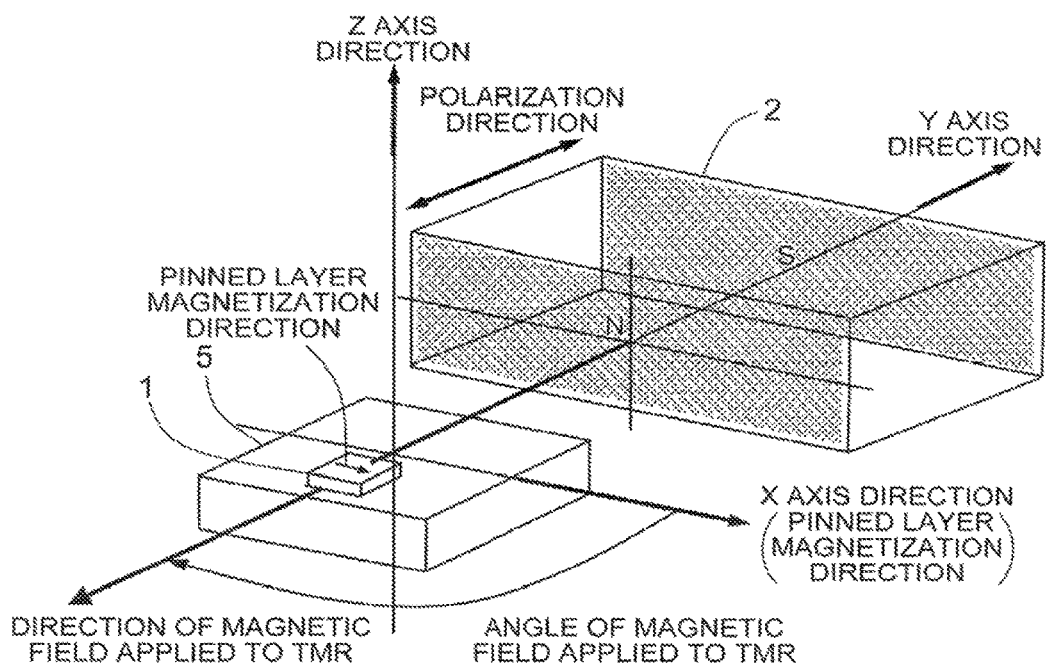
FIG. 47 is a partially enlarged view of the magnetic circuit configuration shown in FIG. 46.
Figure 48A:
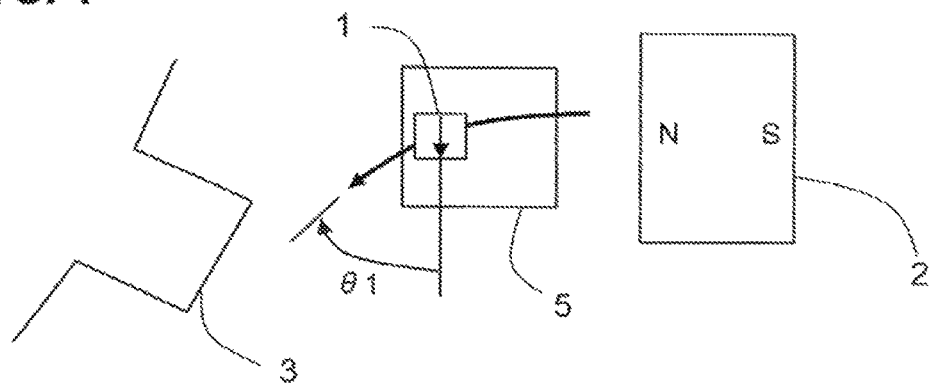
FIG. 48A is an illustrative view relating to an angle of a magnetic field applied to the TMR element provided in the conventional magnetic detection apparatus.
Figure 48B:
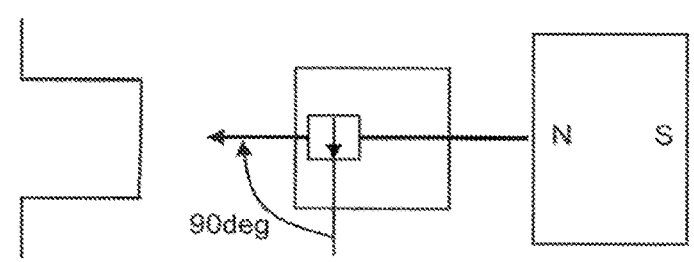
FIG. 48B is an illustrative view relating to an angle of a magnetic field applied to the TMR element provided in the conventional magnetic detection apparatus.
Figure 48C:
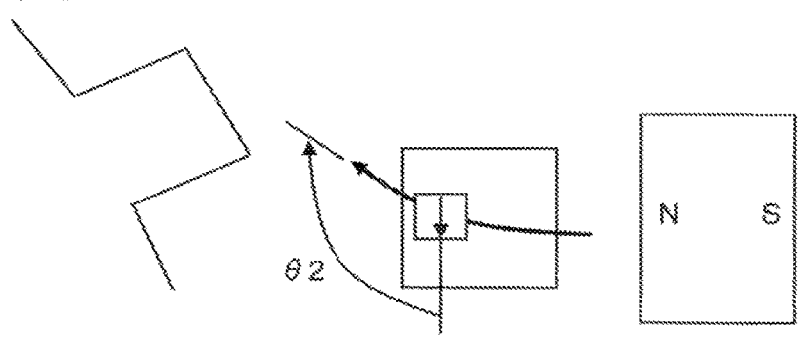
FIG. 48C is an illustrative view relating to an angle of a magnetic field applied to the TMR element provided in the conventional magnetic detection apparatus.
Figure 49:
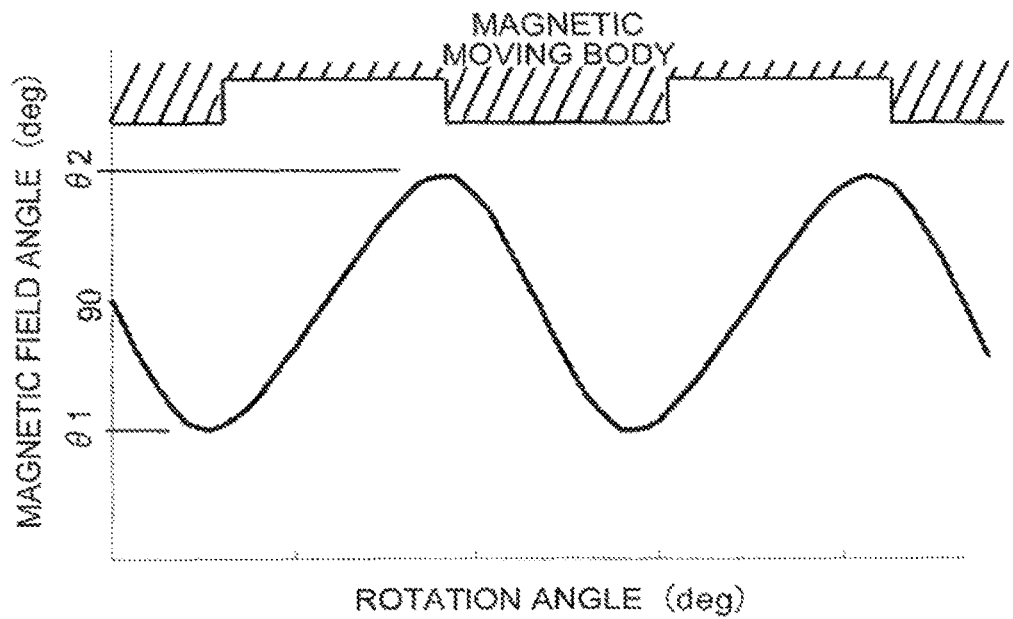
FIG. 49 is a view showing variation in the angle of the magnetic field applied to the TMR element provided in the conventional magnetic detection apparatus.
Figure 50:
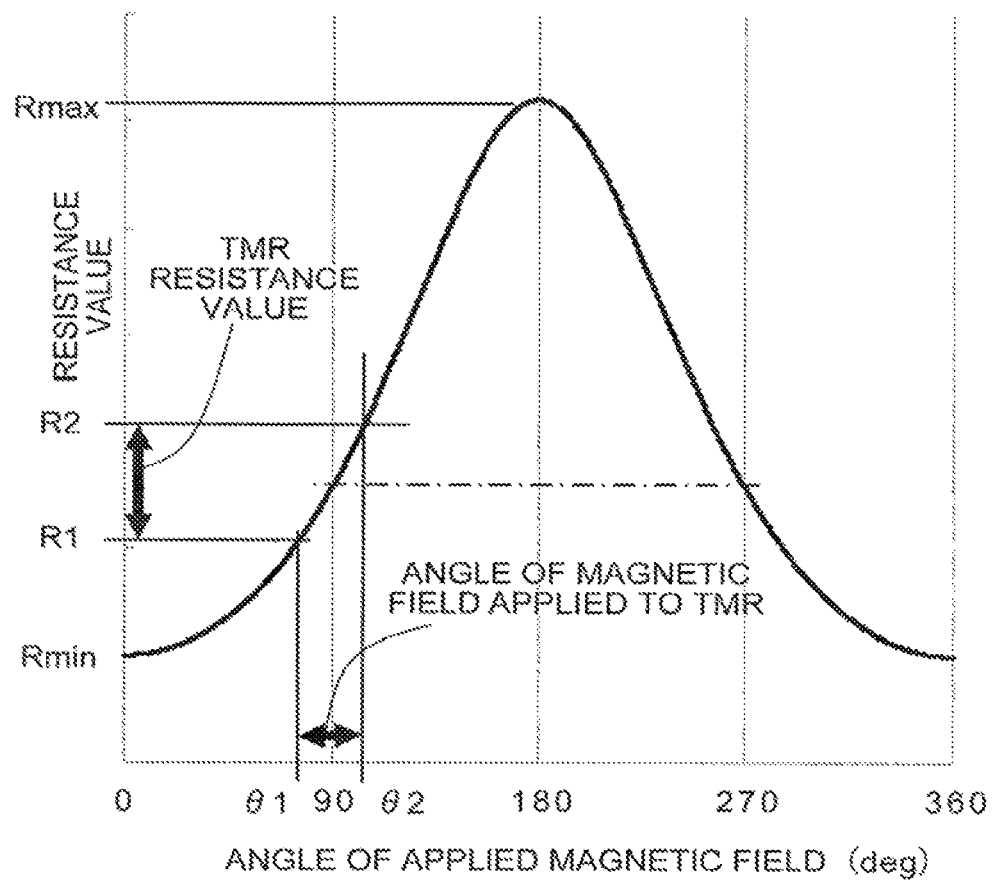
FIG. 50 is a view showing the R-θ characteristic of the TMR element provided in the conventional magnetic detection apparatus.
Figure 51:
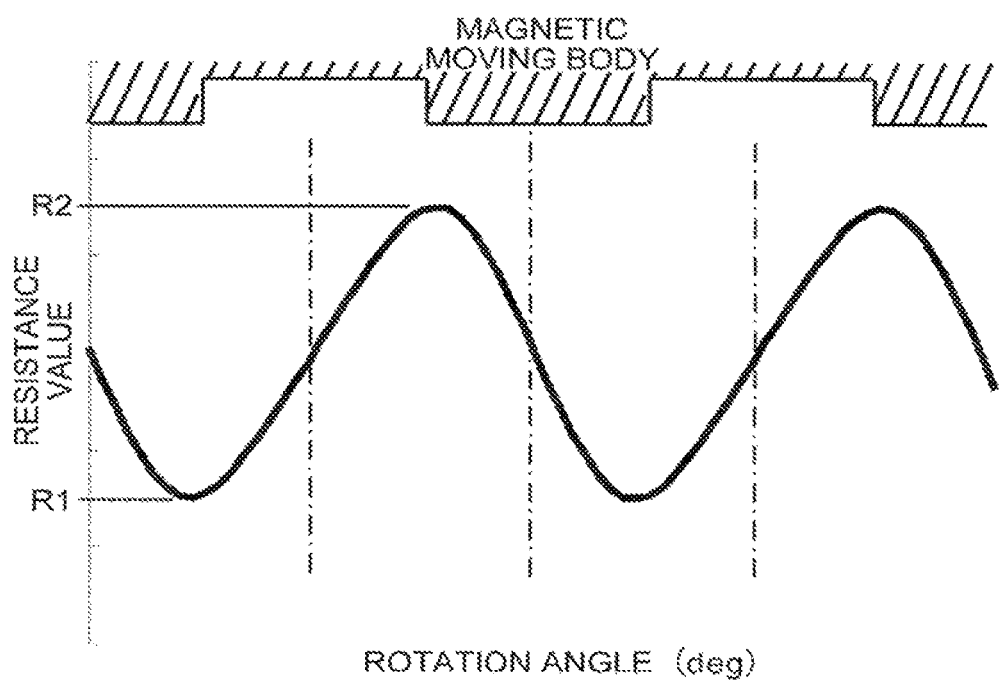
FIG. 51 is a view showing resistance change in the TMR element provided in the conventional magnetic detection apparatus.

FIG. 41 is a view showing the R-θ characteristics of the TMR elements provided in a magnetic detection apparatus according to the seventh embodiment of this invention. Further, FIG. 42 is a view showing resistance change in the TMR elements provided in the magnetic detection apparatus according to the seventh embodiment of this invention. Furthermore, FIG. 43 is a view showing the temperature dependence of an operation waveform generated by the magnetic detection apparatus according to the seventh embodiment of this invention.

By providing the magnetic body guide 36, resistance change such as that shown in FIG. 41 is generated. As a result, as shown in FIG. 42, resistance value change is obtained such that the TMR element 31a and the TMR element 31b operate at substantially identical resistance change centers in accordance with the irregularities on the magnetic moving body. This resistance value change can then be processed using the processing circuit according to the fourth embodiment, shown in FIG. 25.

When the magnetic body guide 36 is not provided, a temperature offset is generated in the differential output voltage, as described above using FIG. 27, with the result that the final output likewise shifts according to the temperature. When the magnetic body guide 36 is provided, however, the temperature offset in the differential amplifier voltage can be reduced in a similar manner to the effect the fifth embodiment, as shown in FIG. 43.

According to the seventh embodiment, as described above, by providing the magnetic body guide between the TMR elements and the magnet, a bridge circuit can be configured from TMR elements to which identical bias magnetic fields are applied. As a result, the temperature offset of the differential amplifier voltage can be reduced such that the final output is stabilized irrespective of the temperature of the IC. Hence, a similar effect to the fifth embodiment can be realized.

Note that in the embodiments described above, cases in which two, four, or six TMR elements are used as the plurality of TMR elements were described as examples, but similar effects can be obtained using a plurality of TMR elements including a different number of elements.

The invention claimed is:

1. A magnetic detection apparatus comprising:
an element having a magnetic tunnel junction structure configured such that an insulating layer is sandwiched between a pinned layer having a fixed magnetization direction and a free layer having a magnetization direction that varies freely;
a magnet disposed in order to apply a magnetic field to said element; and
a rotating magnetic moving body having an irregular shape that induces change in said magnetic field,
said magnetic detection apparatus being configured such that when, using said element as a reference, said magnetization direction of said pinned layer is set as an X axis direction, a direction perpendicular to said X axis direction and perpendicular to a plane of said pinned layer is set as a Z axis direction, and a direction perpendicular to an XZ plane constituted by said X axis direction and said Z axis direction is set as a Y axis direction, said magnetic moving body, which is disposed opposite said element in said Y axis direction via a gap relative to said element, rotates about a rotary shaft such that a part thereof disposed opposite said element moves in a parallel direction to said X axis direction, whereby said magnetic detection apparatus detects said irregular shape of said part disposed opposite said element from a magnetic resistance that varies as said magnetic moving body rotates, wherein
said magnet is polarized in said Z axis direction, and disposed in said Z axis direction via a gap relative to said element.

2. The magnetic detection apparatus according to claim 1, wherein
said element is constituted by first two elements, said first two elements are disposed side by side in said Y axis direction on either side of a plane defined by said Z axis direction and a line that is parallel to said X axis direction and bisects a Y axis direction dimension of said magnet, and said irregular shape is detected by forming a bridge circuit by said first two elements.

3. The magnetic detection apparatus according to claim 2, wherein said first two elements are disposed side by side in said Y axis direction symmetrically on either side of said plane.

4. A magnetic detection apparatus, wherein a first magnetic detection circuit is formed from said first two elements according to claim 3, wherein a second magnetic detection circuit is formed from second two elements included in said element, said second two elements being disposed side by side in said X axis direction symmetrically on either side of a plane defined by said Z axis direction and a line that is parallel to said Y axis direction and bisects an X axis direction dimension of said magnet, wherein the first magnetic detection circuit and the second magnetic detection circuit are formed on a single substrate, and wherein a rotation direction of said magnetic moving body is detected from an irregular shape detected by said first magnetic detection circuit and an irregular shape detected by said second magnetic detection circuit.

5. A magnetic detection apparatus, wherein a first magnetic detection circuit is formed from said first two elements according to claim 3, wherein a second magnetic detection circuit is formed from first four elements included in said element forming two pairs, two elements among said first four elements forming a first pair and two elements among said first four elements forming a second pair being respectively disposed side by side in said X axis direction symmetrically on either side of said plane defined by said Z axis direction and said line that is parallel to said Y axis direction and bisects said X axis direction dimension of said magnet, said two pairs being disposed symmetrically on either side of a plane defined by said Z axis direction and a line that is parallel to said X axis direction and bisects a Y axis direction dimension, wherein the first magnetic detection circuit and the second magnetic detection circuit are formed on a single substrate, and wherein a rotation direction of said magnetic moving body is detected from an irregular shape detected by said first magnetic detection circuit and an irregular shape detected by said second magnetic detection circuit.

6. A magnetic detection apparatus, wherein a first magnetic detection circuit is formed from said first two elements according to claim 3, wherein a second magnetic detection circuit formed from second four elements included in said element forming two pairs, two elements among said second four elements forming a first pair and two elements among said second four elements forming a second pair being respectively disposed side by side in said Y axis direction symmetrically on either side of a plane defined by said Z axis direction and a line that is parallel to said X axis direction and bisects a Y axis direction dimension of said magnet, said two pairs being disposed symmetrically on either side of said plane defined by said Z axis direction and said line that is parallel to said Y axis direction and bisects said X axis direction dimension, wherein the first magnetic detection circuit and the second magnetic detection circuit are formed on a single substrate, and wherein a rotation direction of said magnetic moving body is detected from an irregular shape detected by said first magnetic detection circuit and an irregular shape detected by said second magnetic detection circuit.

7. The magnetic detection apparatus according to claim 3, further comprising a magnetic body guide that includes a pair of projecting portions projecting toward a side of said element, and is disposed between said element and said magnet in said Z axis direction as means for adjusting a magnetic field applied to said element.

8. A magnetic detection apparatus, wherein a first magnetic detection circuit is formed from said first two elements according to claim 2;

wherein a second magnetic detection circuit is formed from second two elements included in said element, said second two elements being disposed side by side in said X axis direction symmetrically on either side of a plane defined by said Z axis direction and a line that is parallel to said Y axis direction and bisects an X axis direction dimension of said magnet, wherein the first magnetic detection circuit and the second magnetic detection circuit are formed on a single substrate, and wherein rotation direction of said magnetic moving body is detected from an irregular shape detected by said first magnetic detection circuit and an irregular shape detected by said second magnetic detection circuit.

9. A magnetic detection apparatus, wherein a first magnetic detection circuit is formed from said first two element according to claim 2, wherein a second magnetic detection circuit is formed from first four elements included in said element forming two pairs, two elements among said first four elements forming a first pair and two elements among said first four elements forming a second pair being respectively disposed side by side in said X axis direction symmetrically on either side of said plane defined by said Z axis direction and said line that is parallel to said Y axis direction and bisects said X axis direction dimension of said magnet, said two pairs being disposed symmetrically on either side of a plane defined by said Z axis direction and a line that is parallel to said X axis direction and bisects a Y axis direction dimension, wherein the first magnetic detection circuit and the second magnetic detection circuit are formed on a single substrate, and wherein a rotation direction of said magnetic moving body is detected from an irregular shape detected by said first magnetic detection circuit and an irregular shape detected by said second magnetic detection circuit.

10. A magnetic detection apparatus, wherein a first magnetic detection circuit is formed from said first two elements according to claim 2, wherein a second magnetic detection circuit formed from second four elements included in said element forming two pairs, two elements among said second four elements forming a first pair and two elements among said second four elements forming a second pair being respectively disposed side by side in said Y axis direction symmetrically on either side of a plane defined by said Z axis direction and a line that is parallel to said X axis direction and bisects a Y axis direction dimension of said magnet, said two pairs being disposed symmetrically on either side of said plane defined by said Z axis direction and said line that is parallel to said Y axis direction and bisects said X axis direction dimension, wherein the first magnetic detection circuit and the second magnetic detection circuit are formed on a single substrate, and wherein a rotation direction of said magnetic moving body is detected from an irregular shape detected by said first magnetic detection circuit and an irregular shape detected by said second magnetic detection circuit.

11. The magnetic detection apparatus according to claim 2, further comprising a magnetic body guide that includes a pair of projecting portions projecting toward a side of said element, and is disposed between said element and said magnet in said Z axis direction as means for adjusting a magnetic field applied to said element.

12. The magnetic detection apparatus according to claim 1, wherein said element is constituted by second two elements, said second two elements are disposed side by side in said X axis direction symmetrically on either side of a plane defined by said Z axis direction and a line that is parallel to said Y axis direction and bisects an X axis direction dimension of said magnet, and said irregular shape is detected by forming a bridge circuit by said second two elements.

13. The magnetic detection apparatus according to claim 12, further comprising a magnetic body guide that includes a pair of projecting portions projecting toward a side of said element, and is disposed between said element and said magnet in said Z axis direction as means for adjusting a magnetic field applied to said element.

14. The magnetic detection apparatus according to claim 1, wherein said element is constituted by first four elements forming two pairs, two elements among said first four elements forming a first pair and two elements among said first four elements forming a second pair are respectively disposed side by side in said X axis direction symmetrically on either side of said plane defined by said Z axis direction and said line that is parallel to said Y axis direction and bisects said X axis direction dimension of said magnet, said two pairs are disposed symmetrically on either side of a plane defined by said Z axis direction and a line that is parallel to said X axis direction and bisects a Y axis direction dimension, and said irregular shape is detected by obtaining a differential signal from a bridge circuit formed by said two elements forming said first pair and a bridge circuit formed by said two elements forming said second pair.

15. The magnetic detection apparatus according to claim 14, further comprising a magnetic body guide that includes a pair of projecting portions projecting toward a side of said element, and is disposed between said element and said magnet in said Z axis direction as means for adjusting a magnetic field applied to said element.

16. The magnetic detection apparatus according to claim 1, wherein said element is constituted by second four elements forming two pairs, two elements among said second four elements forming a first pair and two elements among said second four elements forming a second pair are respectively disposed side by side in said Y axis direction symmetrically on either side of a plane defined by said Z axis direction and a line that is parallel to said X axis direction and bisects a Y axis direction dimension of said magnet, said two pairs are disposed symmetrically on either side of said plane defined by said Z axis direction and said line that is parallel to said Y axis direction and bisects said X axis direction dimension, and said irregular shape is detected by obtaining a differential signal from a bridge circuit formed by said two elements forming said first pair and a bridge circuit formed by said two elements forming said second pair.

17. The magnetic detection apparatus according to claim 16, further comprising a magnetic body guide that includes a pair of projecting portions projecting toward a side of said element, and is disposed between said element and said magnet in said Z axis direction as means for adjusting a magnetic field applied to said element.

18. The magnetic detection apparatus according to claim 1, further comprising a magnetic body guide that includes a pair of projecting portions projecting toward a side of said element, and is disposed between said element and said magnet in said Z axis direction as means for adjusting a magnetic field applied to said element.

* * * * *